(12) United States Patent
Saxena et al.

(10) Patent No.: US 9,754,836 B2
(45) Date of Patent: Sep. 5, 2017

(54) PACKAGING METHODS FOR FABRICATION OF ANALYTICAL DEVICE PACKAGES AND ANALYTICAL DEVICE PACKAGES MADE THEREOF

(71) Applicant: Pacific Biosciences of California, Inc., Menlo Park, CA (US)

(72) Inventors: Ravi Saxena, Millbrae, CA (US); Elizabeth Logan, Danville, CA (US); Takashi Orimoto, Sunnyvale, CA (US)

(73) Assignee: Pacific Biosciences of California, Inc., Menlo Park, CA (US)

( * ) Notice: Subject to any disclaimer, the term of this patent is extended or adjusted under 35 U.S.C. 154(b) by 0 days.

(21) Appl. No.: 15/354,588

(22) Filed: Nov. 17, 2016

(65) Prior Publication Data
US 2017/0140990 A1    May 18, 2017

Related U.S. Application Data

(60) Provisional application No. 62/256,440, filed on Nov. 17, 2015.

(51) Int. Cl.
*H01L 21/00* (2006.01)
*H01L 21/78* (2006.01)
*H01L 23/31* (2006.01)

(52) U.S. Cl.
CPC .......... *H01L 21/78* (2013.01); *H01L 23/3171* (2013.01)

(58) Field of Classification Search
CPC .......................... H01L 21/78; H01L 23/3171
See application file for complete search history.

(56) References Cited

U.S. PATENT DOCUMENTS

| 7,339,738 | B1* | 3/2008 | Carr ................... G02B 26/0808 |
|---|---|---|---|
| | | | 359/291 |
| 8,148,808 | B2 | 4/2012 | Braden et al. |
| 8,501,406 | B1 | 8/2013 | Gray et al. |
| 8,649,011 | B2 | 2/2014 | McCaffrey et al. |
| 8,802,600 | B2 | 8/2014 | Rank et al. |
| 9,157,864 | B2 | 10/2015 | Fehr et al. |
| 2010/0099582 | A1 | 4/2010 | Chiu et al. |

(Continued)

OTHER PUBLICATIONS

International Search Report and Written Opinion, WO 2017/0087662 (PCT/US2016/062516), dated Apr. 26, 2017, Korean Intellectual Property Office.

*Primary Examiner* — Richard Booth
(74) *Attorney, Agent, or Firm* — Robert H. Reamey

(57) ABSTRACT

Disclosed are packaging methods for the fabrication of analytical device packages and fabricated analytical device packages. The methods include providing a sensor wafer and mounting individual plates or a plate wafer on the sensor wafer. The sensor wafer includes sensor chips with aperture regions and is treated with selective depositions, either prior to or during the fabrication of the analytical device packages, to produce different surface characteristics at different portions of the aperture regions. Before dicing the sensor wafer, openings of the individual plates or the plate wafer are covered by a protective layer to protect surface characteristics at different portions of the aperture regions. A fabricated analytical device package includes a sensor chip with different surface characteristics, a plate, a packaging substrate and an optional cover.

56 Claims, 32 Drawing Sheets

(56) References Cited

U.S. PATENT DOCUMENTS

| | | |
|---|---|---|
| 2010/0298165 A1 | 11/2010 | Besemer et al. |
| 2012/0021525 A1 | 1/2012 | Fehr et al. |
| 2013/0296195 A1 | 11/2013 | Gray et al. |
| 2014/0099776 A1 | 4/2014 | Cheng et al. |
| 2014/0130900 A1 | 5/2014 | Hedges |

* cited by examiner

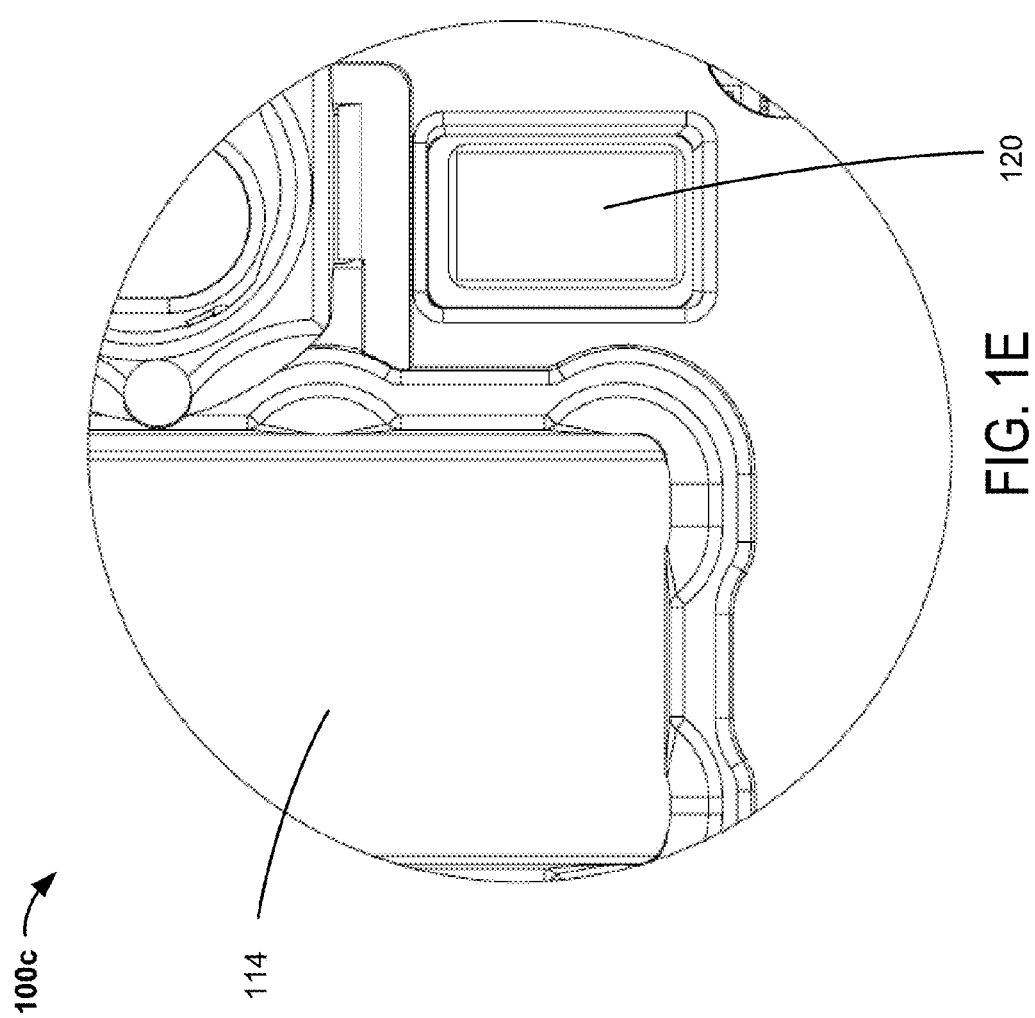

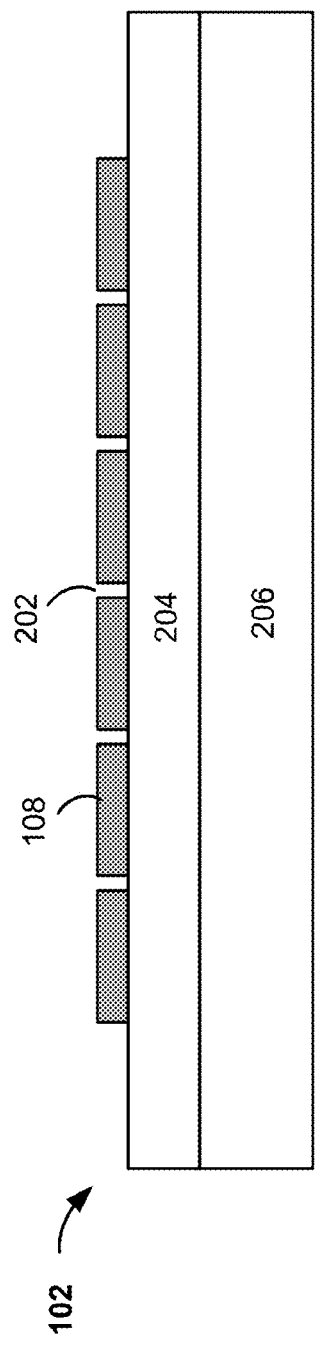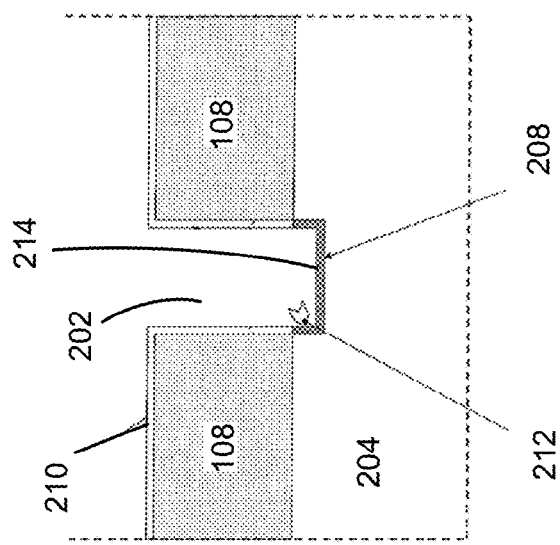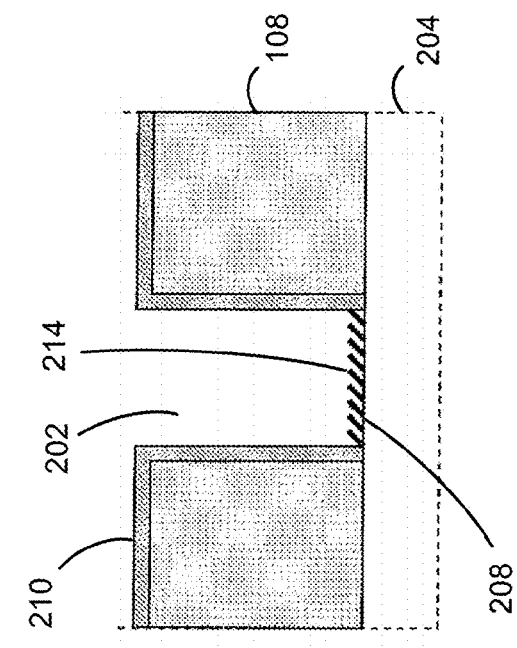
FIG. 2A
FIG. 2B
FIG. 2C

1700

PACKAGING METHODS FOR FABRICATION OF ANALYTICAL DEVICE PACKAGES AND ANALYTICAL DEVICE PACKAGES MADE THEREOF

1. CROSS-REFERENCE TO RELATED APPLICATION

The present application claims priority of U.S. Provisional Patent Application No. 62/256,440 filed Nov. 17, 2015, the entire contents of which application is incorporated herein for all purposes by this reference.

2. FIELD OF THE INVENTION

The present invention generally relates to packaging methods for the fabrication of analytical device packages and analytical device packages made thereof. More particularly, the present invention relates to packaging methods for the fabrication of analytical device packages with sensor chips having different surface characteristics and such analytical device packages made thereof.

3. BACKGROUND

Sensors are used in a wide range of analytical operations to analyze various chemical and biochemical reactions such as nucleic acid sequencing reactions. In many biological and biomedical applications, it is very desirable to have sensors integrated with signal detection devices such as Complementary Metal-Oxide Semiconductor (CMOS) detection circuitry because such integration provides a number of benefits including miniaturization, automated detection, high performance and reduced reagent costs. However, sensors are usually operated in a liquid environment while traditional CMOS circuits are generally designed without concern for contact with aqueous solutions, imposing a great challenge in the development of integration and packaging processes. To make robust and reliable analytical device packages, post-sensor and post-CMOS fabrication and packaging processes must meet the needs of every component of each individual device and the interfaces between different components including biochemistry, fluidics, optics and electronics.

In addition, many analytical operations may benefit from the ability to analyze the reaction of individual molecules or a relatively small numbers of molecules. One approach of monitoring only one or a few molecules at a time is to provide a sensor having different characteristic properties on various different portions of optical confinements. For example, it can be desirable to have different surface properties for portions within the observation regions and outside of the observation regions of the optical confinements. Integration of such sensors with CMOS circuits imposes additional difficulties in the development of packaging processes as these different characteristic properties cannot be degraded or compromised during the integration and packaging.

There is thus a need in the art for analytical device packages and robust and reliable packaging methods to make analytical device packages.

The information disclosed in this Background section is provided solely to provide a general background of the embodiments described herein and is not an acknowledgement or suggestion that this information forms part of the prior art already known to a person skilled in the art.

4. SUMMARY

The present invention generally provides methods of making analytical device packages and analytical device packages fabricated by the methods.

In one aspect, the present invention provides methods for making analytical device packages that include sensor chips having different surface characteristics. A first method comprises providing a sensor wafer that has been treated with selective depositions, wherein the sensor wafer comprises a plurality of sensor chips, and one or each sensor chip comprises a plurality of electrical contacts and an aperture region with an array of nanometer-scale apertures, and wherein treatment with the selective depositions produces different surface characteristics at different portions of the aperture region. The first method further comprises mounting a plurality of plates on the sensor wafer, wherein one or each plate is aligned with a corresponding sensor chip such that an opening of the plate is above the aperture region of the corresponding sensor chip, and the opening of the plate is covered by a protective layer to protect the aperture region of the corresponding sensor chip during at least one subsequent process. The first method then proceeds to dicing the sensor wafer to obtain a plurality of dies, wherein one or each die comprises one sensor chip and one plate on top of the one sensor chip. After a packaging substrate or a plurality of packaging substrates is provided, the first method continues to attaching a die to one or each of the packaging substrates, connecting the electrical contacts of a respective sensor chip with the electrical contacts of a corresponding packaging substrate, and removing the protective layer from the plate of the die to expose the aperture region.

A second method comprises providing a sensor wafer that has been treated with selective depositions, wherein the sensor wafer comprises a plurality of sensor chips, and one or each sensor chip comprises a plurality of electrical contacts and an aperture region with an array of nanometer-scale apertures, and wherein treatment with the selective depositions produces different surface characteristics at different portions of the aperture region. The second method also comprises providing a plate wafer comprising a plurality of plates, wherein one or each plate of the plurality of plates has an opening. The second method further comprises bonding the plate wafer with and on top of the sensor wafer, wherein one or each plate is aligned with a corresponding sensor chip such that the opening of the plate is above the aperture region of the corresponding sensor chip. The second method then proceeds to overlaying a protective layer on the plate wafer to cover the openings of the plurality of plates to protect the aperture regions during at least one subsequent process. Once the protective layer is overlaid, the second method continues to performing a first etching, following plate wafer dicing fiducials, to dice the protective layer and the plate wafer to reveal the electrical contacts on the sensor wafer, and performing a second etching, along sensor wafer dicing streets, to dice the sensor wafer to obtain a plurality of dies, wherein each die of the plurality of dies comprises one sensor chip and one plate on top of the one sensor chip. Afterwards, the second method proceeds to attaching a die to each of the packaging substrates, connecting the electrical contacts of a respective sensor chip with the electrical contacts of a corresponding packaging substrate, and removing the protective layer from the plate of the die to expose the aperture region.

A third method comprises providing a sensor wafer that has been treated with selective depositions, wherein the sensor wafer comprises a plurality of sensor chips, and each sensor chip comprises a plurality of electrical contacts and an aperture region with an array of nanometer-scale apertures, wherein treatment with the selective depositions produces different surface characteristics at different portions of the aperture region. The third method also comprises dicing the sensor wafer, using a laser, to obtain a plurality of dies, wherein each die comprises one sensor chip. Once a packaging substrate is provided, the method comprises attaching a die to the packaging substrate and then connecting the electrical contacts of the sensor chip with the electrical contacts of the packaging substrate. In some cases, the third method also comprises mounting, before dicing the sensor wafer, a plurality of plates on the sensor wafer, wherein each plate is aligned with a corresponding sensor chip such that an opening of the plate is above the aperture region of the corresponding sensor chip. In such cases, in addition to one sensor chip, each die in the plurality of dies obtained by dicing the sensor wafer further comprises one plate on top of the one sensor chip. In some cases, mounting is performed after attaching a die to a packaging substrate. In such cases, the method comprises mounting, after attaching a die to a packaging substrate, a plate on top of the sensor chip.

In a related aspect, the present invention provides the methods comprising alternative, additional or optional processes. In some embodiments, instead of providing a sensor wafer that has been treated with selective depositions, the methods comprise providing a sensor wafer with a plurality of sensor chips, wherein each sensor chip comprises a plurality of electrical contacts and an aperture region with an array of nanometer-scale apertures, and treating the sensor wafer with selective depositions to produce different surface characteristics at different portions of the aperture region. Treatment with the selective depositions produces a first surface characteristic and a second surface characteristic that is different from the first surface characteristic. The first surface characteristic is produced on a base of at least one nanometer-scale aperture in at least one sensor chip and the second surface characteristic on a side wall or a top of the at least one nanometer-scale aperture in the at least one sensor chip. In some embodiments, the first surface characteristic has a transparent portion that is bound with sufficient coupling agent for binding a desired molecule. The second surface characteristic has an opaque or reflective portion that is either coated with a passivating compound, having no coupling agent or having very low levels of coupling agent.

In some embodiments, the first method further comprises providing a plate wafer, overlaying the protective layer on the plate wafer, and dicing the plate wafer with the protective layer overlaid on the plate wafer to obtain the plurality of plates with the protective layer on top. In some embodiments, prior to overlaying the protective layer on the plate wafer or bonding the plate wafer to the sensor wafer, the plate wafer is diced or partially diced to provide bonding pad grooves. In such embodiments, the protective layer is overlaid on a side of the plate wafer opposite to where the bonding pad grooves are formed.

In some embodiments, the methods comprise providing a sensor wafer and a plate wafer, bonding the plate wafer with and on top of the sensor wafer, treating the sensor wafer with selective depositions, and overlaying a protective layer on the plate wafer to cover the openings of the plurality of plates before performing the first and second etchings. In one case, treating the sensor wafer with selective depositions is performed prior to bonding the plate wafer to the sensor wafer. In another case, treating the sensor wafer with selective depositions is performed subsequent to bonding the plate wafer to the sensor wafer.

In an embodiment, removing the protective layer from the plate of the die is conducted prior to connecting the electrical contacts. In another embodiment, removing the protective layer from the plate of the die is conducted subsequent to connecting the electrical contacts.

In some embodiments, the methods comprise one or more of the following additional or optional processes: trimming the protective layer along an edge of the plate wafer after overlaying the protective layer on the plate wafer, inspecting quality of the die prior to attaching the die to the packaging substrate, encapsulating electrical bonds that connect the electrical contacts of the sensor chip with the electrical contacts of the packaging substrate, attaching a cover to the die and/or the packaging substrate to protect the die, printing, inscribing or attaching a product identification on the packaging substrate, and programming a chip identifier to the sensor chip. In one embodiment, the cover comprises a base formed with one or more of a fluid inlet port, a fluid outlet port and an optical port, wherein the fluid inlet and outlet ports are fluidly connected to the opening of the plate, and the optical port is configured for coupling with an elimination light source. In another embodiment, the cover additionally or optionally comprises a top fixedly coupled to the base or monolithically formed with the base. The top comprises a port used for picking up the analytical device package.

In some embodiments, the methods further comprise writing, prior to encapsulating the electrical bonds, a dam on a package produced by attaching a die to a packaging substrate. The dam partitions the package into a plurality of regions includes a first region. In some cases, at least a portion of the electrical bonds, the electrical contacts of the sensor chip, or the electrical contacts of the packaging substrate resides in the first region, and the encapsulating of the electrical bonds fills at least partially the first region with a first filling material. In an embodiment, the dam is written to fill a gap between the top plate and the substrate, and serves as a barrier to keep a second region in the plurality of regions free from encapsulation during the encapsulating of the electrical bonds that fills at least partially the first region. In an embodiment, the plurality of regions includes a third region, and the encapsulating of the electrical bonds fills at least partially the third region with a material the same as or different from the first filling material.

In another aspect, the present invention provides analytical device packages fabricated by the methods of the present invention. An analytical device package comprises a sensor chip, a plate and a packaging substrate. The sensor chip comprises an aperture region with an array of nanometer-scale apertures, wherein the sensor chip has different surface characteristics at different portions of the aperture region. The plate has an opening and is fixedly mounted on top of the sensor chip such that the opening of the plate is above the aperture region of the sensor chip. The packaging substrate comprises a plurality of electrical contacts electrically connected to a plurality of electrical contacts on the sensor chip. In some cases, the sensor chip comprises an aperture region with at least 1,000, at least 10,000, at least 100,000, at least 1,000,000, or at least 10,000,000 nanometer-scale apertures.

In an embodiment, the different surface characteristics at different portions of the aperture region is produced by exposing a surface of the sensor chip having both silica-based portions and metal or metal oxide portions to an agent that preferentially binds to the metal or metal oxide portions to produce passivated metal or metal oxide portions of the surface, and exposing the surface of the sensor chip to a silica functionalizing agent that binds to both the silica-based portions and the passivated metal or metal oxide portions of the surface, then rinsing the surface of the packaging substrate. In another embodiment, the different surface characteristics at different portions of the aperture region is produced by treating a surface of the sensor chip having both silica-based portions and metal or metal oxide portions with a compound comprising phosphate or phosphonate groups to produce passivated metal or metal oxide portions of the surface, and treating the surface of the sensor chip with a silica functionalizing agent that binds to both the silica-based and the passivated metal or metal oxide portions of the surface.

In some embodiments, the sensor chip further comprises a cover fixedly coupled to one or more of the sensor chip, the plate and the packaging substrate to protect the sensor chip. The cover is formed with a fluid inlet port, a fluid outlet port and an optical port, wherein the fluid inlet and outlet ports are fluidly connected to the opening of the plate, and the optical port is configured for coupling with an elimination light source. In some embodiments, the sensor chip further comprises a waveguide layer below the aperture region and configured for illumination of the array of the array of the nanometer-scale apertures, and a detection layer below the waveguide layer and configured for detecting optical signals emitted from the fluid in the array of the nanometer-scale apertures. In some cases, the second layer comprises an array of pixels with one or more pixels designated for each nanometer-scale aperture. In some cases, the detection layer comprises at least 1 million pixels, at least 2 million pixels, at least 3 million pixels, at least 4 million pixels, or at least 5 million pixels, with one or more pixels designated for each nanometer-scale aperture.

The systems and methods of the present invention have other features and advantages that will be apparent from or are set forth in more detail in the accompanying drawings, which are incorporated herein, and the following Detailed Description, which together serve to explain certain principles of the present invention.

5. BRIEF DESCRIPTION OF THE DRAWINGS

The accompanying drawings, which are incorporated into and constitute a part of this specification, illustrate one or more embodiments of the present application and, together with the detailed description, serve to explain the principles and implementations of the application.

FIG. 1E is a partially enlarged view of the circle E in FIG. 1D.

FIG. 2A illustrates an exemplary sensor chip in accordance with some embodiments of the present invention.

FIG. 2B illustrates an exemplary nanometer-scale aperture with different surface characteristics in accordance with some embodiments of the present invention.

FIG. 2C illustrates another exemplary nanometer-scale aperture with different surface characteristics in accordance with some embodiments of the present invention.

Figure 16:
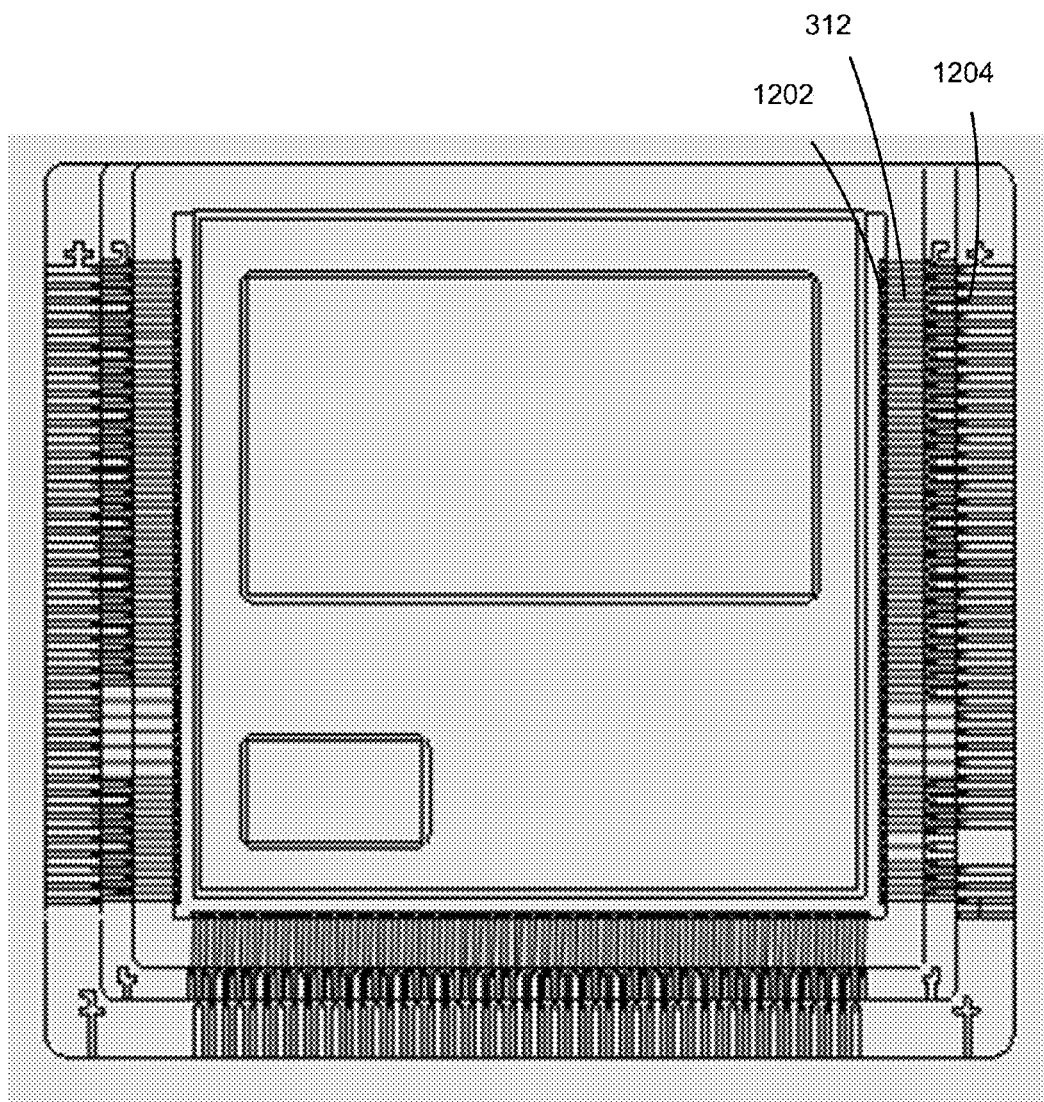

FIG. 16 schematically illustrates a wire bond diagram in accordance with some embodiments of the present invention.

Figure 17A:
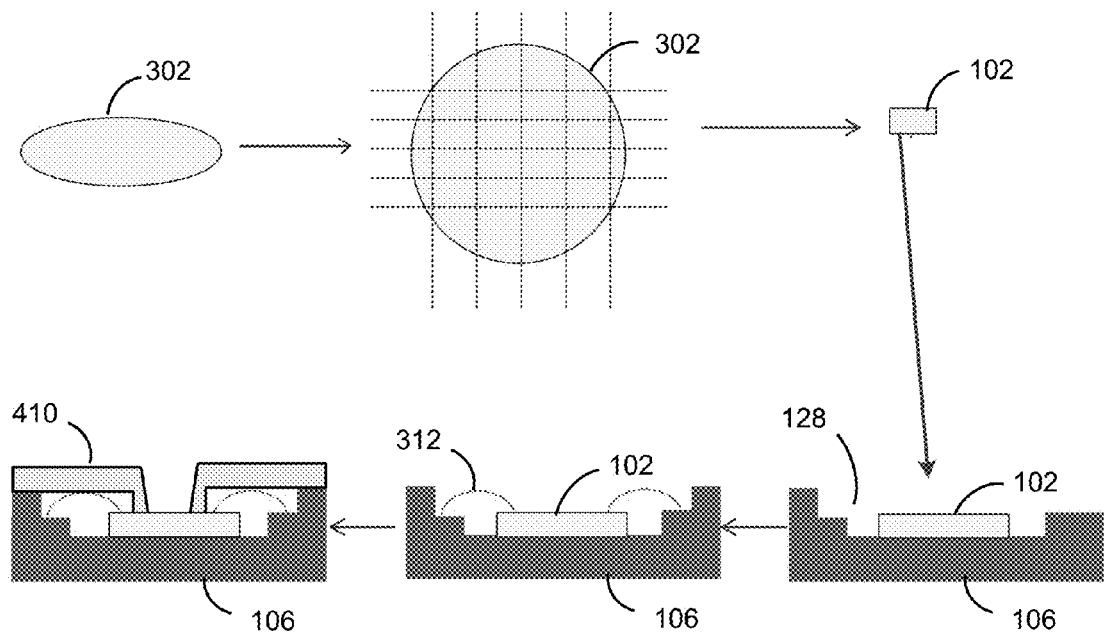

FIG. 17A is a block diagram illustrating a third exemplary method for the fabrication of analytical device packages in accordance with some embodiments of the present invention.

Figure 17B:
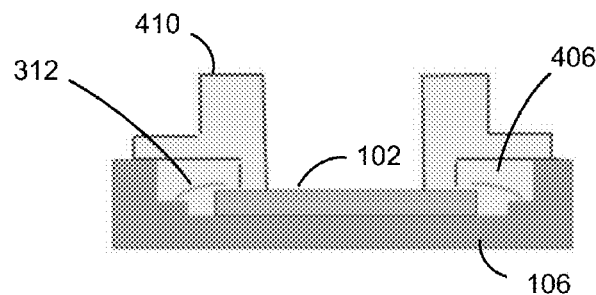

FIG. 17B illustrates additional or optional processes for the fabrication of analytical device packages in accordance with some embodiments of the present invention.

Figure 18:
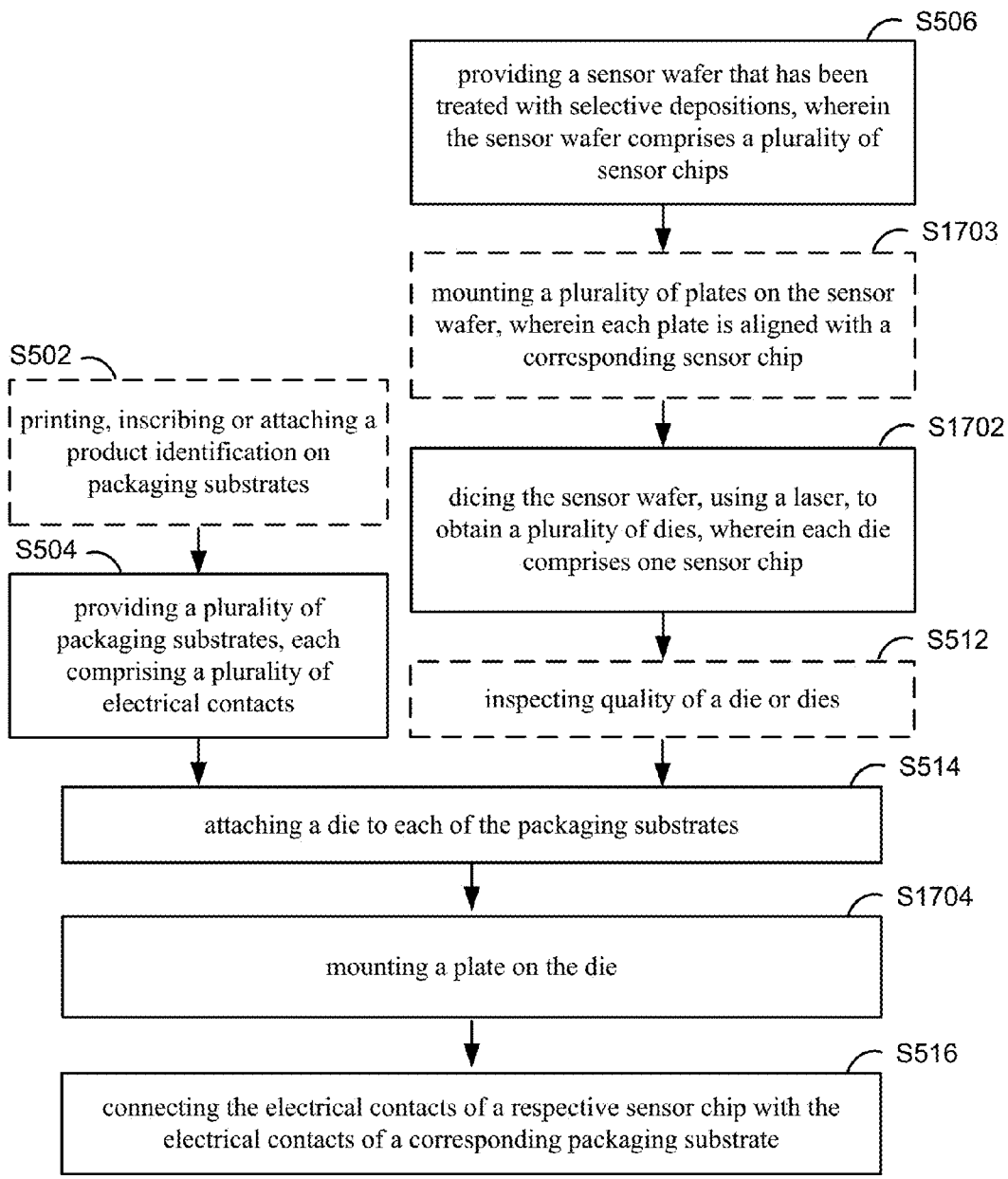

FIG. 18 is a flow chart illustrating the third exemplary method for the fabrication of analytical device packages in accordance with some embodiments of the present invention.

Figure 19A:
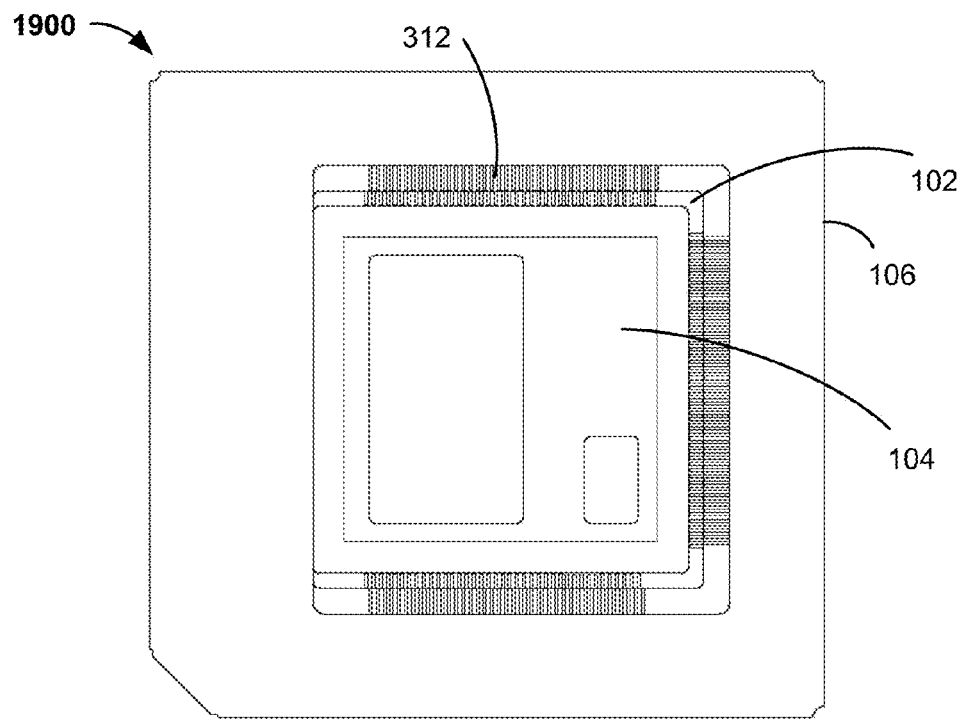

FIG. 19A is a top view illustrating a package in accordance with some embodiments of the present invention.

Figure 19B:
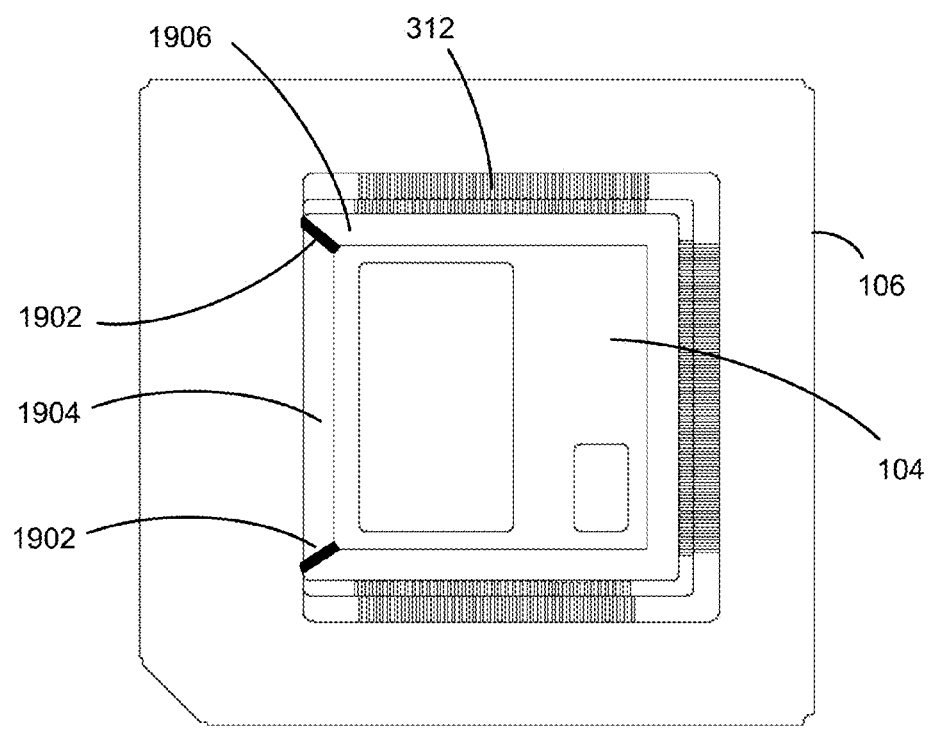

FIG. 19B is a top view illustrating partitioning of the package of FIG. 19A.

Figure 19C:
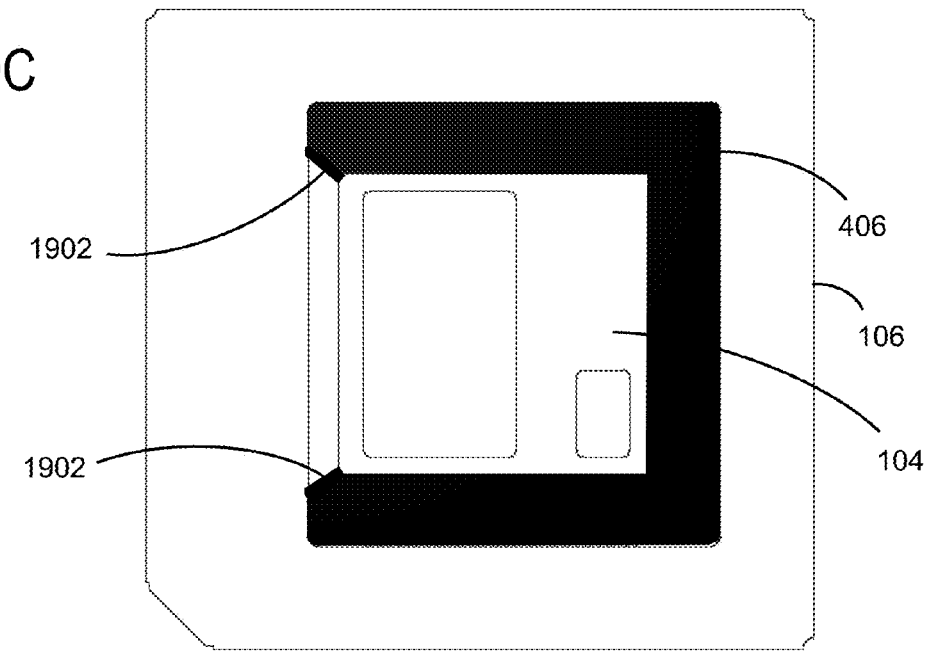

FIG. 19C is a top view illustrating encapsulation of a region of the package of FIG. 19B.

Figure 19D:
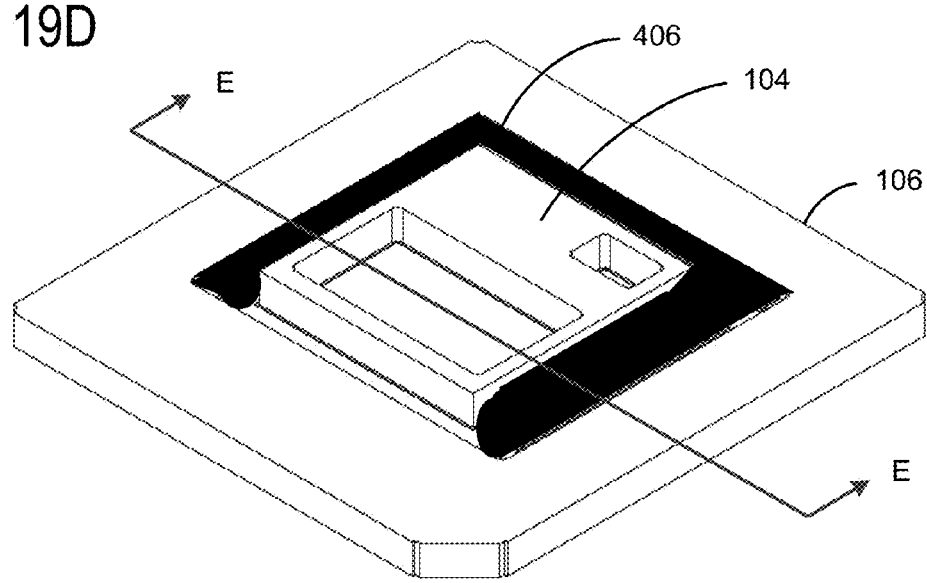

FIG. 19D is a perspective view illustrating encapsulation of a region of the package of FIG. 19B.

Figure 19E:
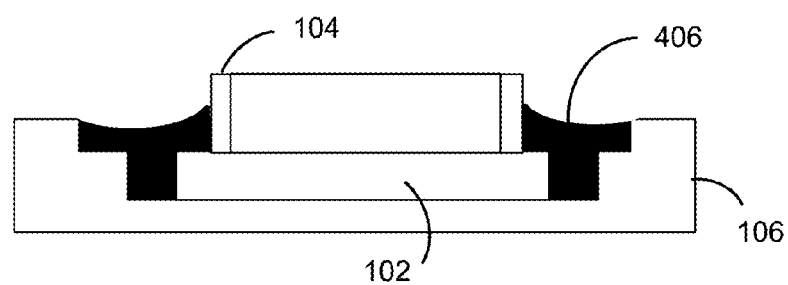

FIG. 19E is a cross-sectional view taken along line E-E of FIG. 19D.

6. DETAILED DESCRIPTION

Reference will now be made in detail to implementations of the present application as illustrated in the accompanying drawings. The same reference indicators will be used throughout the drawings and the following detailed description to refer to the same or like parts. Those of ordinary skill in the art will realize that the following detailed description of the present application is illustrative only and is not intended to be in any way limiting. Other embodiments of the present application will readily suggest themselves to such skilled persons having benefit of this disclosure.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Many modifications and variations of this disclosure can be made without departing from its spirit and scope, as will be apparent to those skilled in the art. The specific embodiments described herein are offered by way of example only, and the disclosure is to be limited only by the terms of the appended claims, along with the full scope of equivalents to which such claims are entitled.

Embodiments of the present invention are described in the context of analytical device packages and methods to make such analytical device packages. In general, an analytical device package as used herein is an integrated system that includes a sensor chip, a plate and a substrate. The sensor chip can be various types of sensor chips such as those disclosed in U.S. Publication Nos. 2012/0021525, 2014/099776 and 2014/130900, and in U.S. Pat. Nos. 8,501,406, 8,649,011, 8,802,600 and 9,157,864, the contents of which are hereby incorporated by reference herein in their entirety. The analytical device packages can be used for a wide range of analytical operations, for instance, for analyzing reactions of individual molecules or a relatively small numbers of molecules in the field of nucleic acid sequence determination.

The plate as used herein refers to a structure configured to protect the sensor chip and in particular to protect the active area (e.g., an aperture region) of the sensor chip during one or more integration and packaging processes. In various cases, the plate is also configured to be in fluidic communication with the aperture region of the sensor chip. Depending on the shape and size of the sensor chip, the use of the analytical device package, preferences and/or other factors, the plate can be configured in a variety of suitable shapes and sizes so long as it protects the aperture region of the sensor chip during integration and packaging processes. The plate can be made of any suitable materials that are compatible with the fluidics and biochemistry in the intended use of the analytical device package. The suitable materials for a plate include but are not limited to silicon, glass, aluminum, plastic, metal, plastic with metal inserts, plastic with surface metallization coating, and metal with passivation.

The substrate or packaging substrate as used herein refers to a structure that provides external interfaces (e.g., electrical contacts) and mechanical support to the sensor chip. Like the plate, the substrate can also have any suitable shapes and sizes depending on the shape and size of the sensor chip, the use of the analytical device package, preferences and/or other factors. The substrate or packaging substrate can be made of any suitable materials, including but not limited to alumina ceramic, aluminum nitride or the like.

By way of illustration, FIG. 1 shows an analytical device package 100a in accordance with some embodiments of the present invention. In the illustrated embodiments, the analytical device package 100a includes a sensor chip 102 having an aperture region 108 for accommodating fluidic samples to be analyzed. To protect the aperture region 108 of the sensor chip 102 during one or more integration and packaging processes, the analytical device package 100a also includes a plate 104 having an opening 110. In some cases, the plate has additional or optional features. For instance, as illustrated in FIG. 1A, the plate 104 is formed with an optical inlet port 112 for coupling with an external illumination light source (e.g., laser). The sensor chip 102 and the plate 104 are aligned such that the opening of the plate is placed above the aperture region of the sensor chip. The analytical device package 100a further includes a substrate 106, which provides external interfaces (e.g., electrical contacts) to the sensor chip and provides mechanical support to the sensor chip during integration and packaging processes and/or during shipping and transportation of the analytical device package.

In some embodiments, an analytical device package includes additional, optional or alternative components and features. As an example, FIG. 1B illustrates an analytical device package 100b including a base 114, which functions as a cover of the analytical device package 100b after assembled and facilitates introduction of fluidic samples to the aperture region 108 of the sensor chip 102. As another example, FIGS. 1C-1G illustrate an analytical device package 100c including a base 114 and a top 122. In this example, the base 114 and the top 122 together function as a cover of the analytical device package 100c after assembly and facilitate introduction of fluidic samples to the aperture region 108 of the sensor chip 102. In some cases, the top 122 is configured for coupling with other external components and/or performing addition functions, for instance, for accommodating a pipette for picking and handling of a sample. As will be appreciated, samples of use with any of the devices or systems described herein may comprise any number of materials, including, but not limited to, bodily fluids (including, but not limited to, blood, urine, serum, lymph, saliva, anal and vaginal secretions, perspiration and semen) and cells of virtually any organism, with mammalian samples being preferred and human samples being particularly preferred; environmental samples (including, but not limited to, air, agricultural, water and soil samples); biological warfare agent samples; research samples (i.e. in the case of nucleic acids, the sample may be the products of an amplification reaction, including both target and signal amplification, such as PCR amplification reactions; purified samples, such as purified genomic DNA, RNA preparations, raw samples (bacteria, virus, genomic DNA, etc.); as will be appreciated by those in the art, virtually any experimental manipulation may have been done on the samples. Like the plate and the packaging substrate, the cover can have any suitable shapes and sizes depending on the shape and size of the sensor chip, the use of the analytical device package, preference and/or other factors. The specific configuration (e.g., shape, size) of the cover includes but is not limited to those in the illustrated embodiments.

Referring to FIGS. 2A-2C, in some embodiments, the aperture region 108 of the sensor chip 102 includes an array of nanometer-scale apertures 202. The array of nanometer-scale apertures 202 can be one-dimensional, two dimensional, or any other suitable forms or patterns such as a "+" sign-like pattern where the gaps are allowance for optical inputs into each quadrant. In some cases, a first layer 204 is formed below the aperture region and includes waveguide(s) configured for illumination of the array of the nanometer-scale apertures. A second layer 206 is formed below the first layer 204 and includes detector(s) configured for detecting optical signals emitted from a sample in the array of the nanometer-scale apertures. In some cases, the second layer comprises an array of pixels with one or more pixels designated for each nanometer-scale aperture. For example, the detection layer comprises at least 1 million pixels, at least 2 million pixels, at least 3 million pixels, at least 4 million pixels, or at least 5 million pixels, with two or more pixels designated for each nanometer-scale aperture.

In some cases, the sensor chip 102 has been treated, either before or during integration and packaging of the analytical device package, with selective depositions such that different portions of the aperture region have different surface characteristics. For instance, FIGS. 2B and 2C show a nanometer-scale aperture 202 having a surface (e.g., the top surface and/or the side surface) selectively coated with a compound 210, for example a phosphate containing passivating compound. The exposed surface of the first layer 204 is functionalized, for example, with a silane coupling agent 208, producing a functionalized region 214 within the observation regions. The coupling agent 208 in the functionalized region 214 can be used to attach a desired molecule (molecule of interest) 212 to the exposed surface of the first layer 204. As such, the desired molecules 212 are ensured to be attached in preselected locations within the observation regions. Methods of producing different surface characteristics at different portions of the aperture region are disclosed for example in U.S. Pat. Nos. 8,501,406 and 8,802,600, the contents of which are hereby incorporated by reference herein in their entirety.

While it is desirable and advantageous to have such different surface characteristics at different portions of the aperture region, preserving such different surface characteristics during integration and packaging processes imposes a great challenge in the development of packaging methods. This is because surface treatment is typically conducted on the sensor wafer level. As such, processes must be designed, materials must be selected, and parameters (e.g., temperature, time) must be controlled, all the way until the analytical device package is fully integrated and assembled, so that they do not degrade or compromise the different surface characteristics at the active area (e.g., an aperture region) of the sensor chip. Care must be taken to protect this active area while any processes that may degrade it are being performed. For instance, the active area of the sensor chip must be protected to avoid exposure to liquid (e.g., water) during dicing processes and physical touch (e.g., mechanical contact by other components or tools) during all handling operations. The humidity and temperature of the processes must also be controlled in the local environment so as to not disturb the surface characteristics at the active area of the sensor chip. Otherwise, the surface characteristics would be comprised or degraded, rendering the active area of the sensor chip unstable. In addition, to make a robust and reliable analytical device package, processes must be designed, materials must be selected, and parameters must be controlled to meet the requirements or constrains of every other component of the system and be compatible with the biochemistry, fluidics, optics and electronics of the system.

Figure 3A:
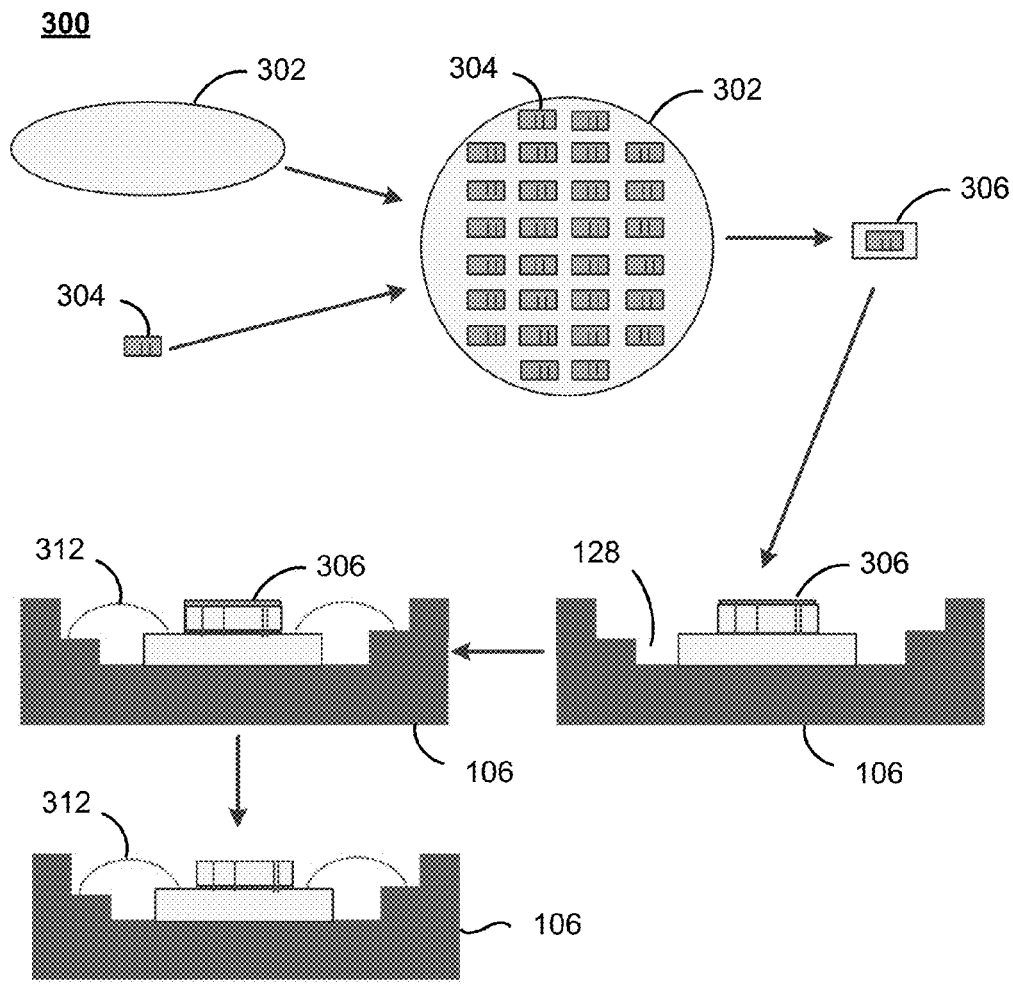
FIG. 3A is a block diagram illustrating a first exemplary method for the fabrication of analytical device packages in accordance with some embodiments of the present invention.
Figure 3B:
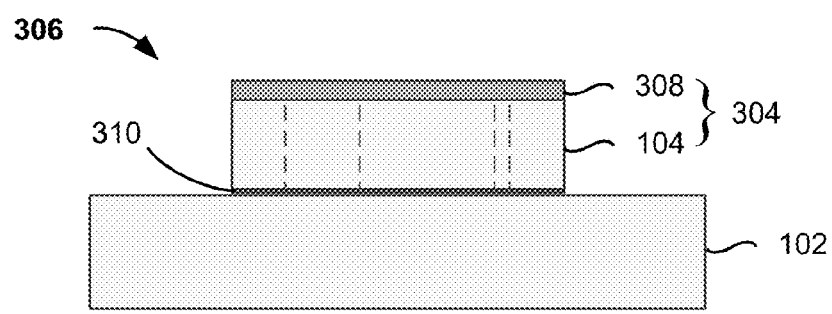
FIG. 3B is an enlarged side view schematically illustrating a die in FIG. 3A.
Figure 5:
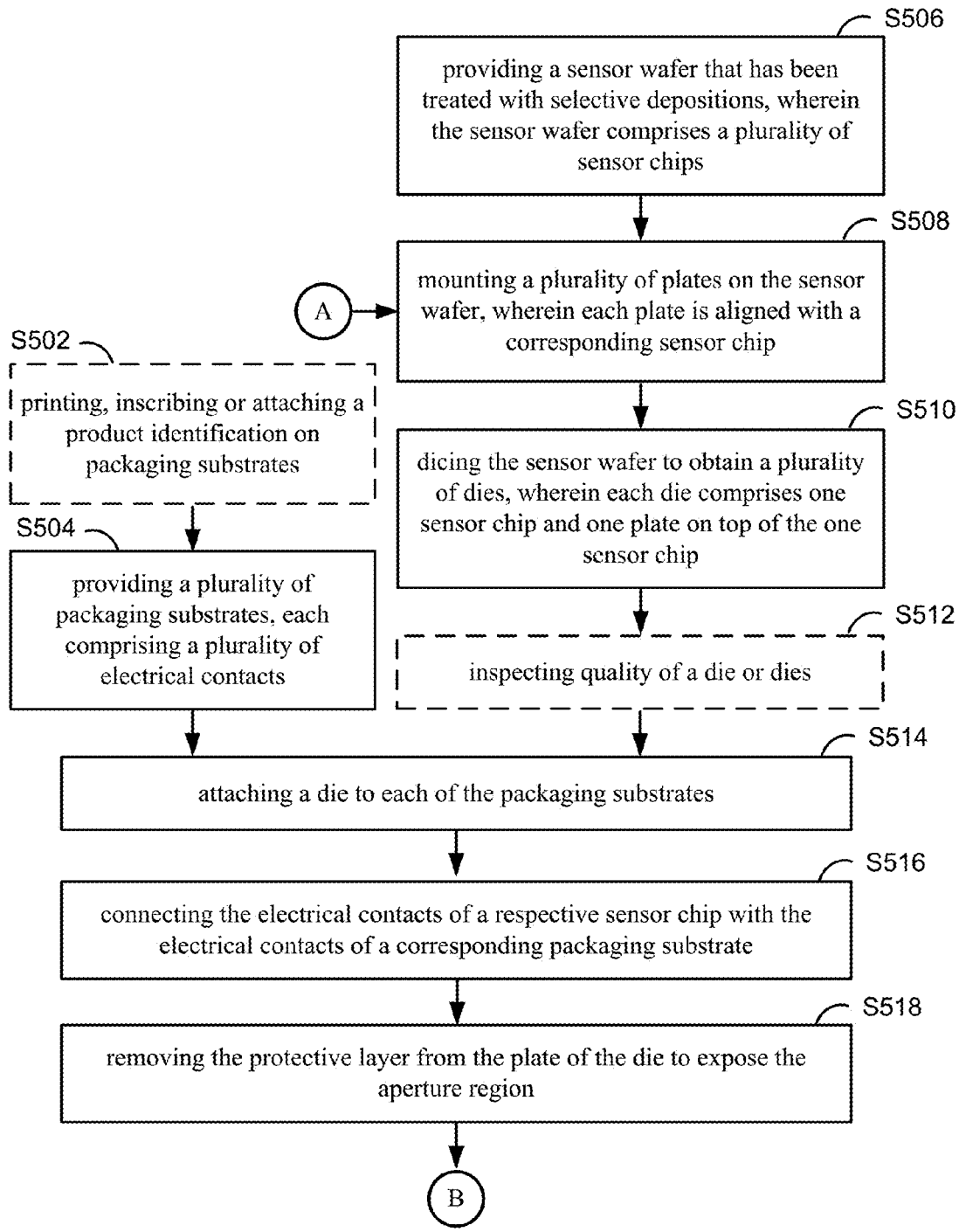
FIG. 5 is a flow chart illustrating the first exemplary method for the fabrication of analytical device packages in accordance with some embodiments of the present invention.

Referring to FIGS. 3A, 3B and 5, there depict a first exemplary method 300 for the fabrication of analytical device packages in accordance with some embodiments of the present invention. As illustrated, a sensor wafer 302 that has been treated with selective depositions is provided at S506. The treated sensor wafer 302 comprises a plurality of sensor chips, for example, comprising at least 10, at least 100, or at least 1,000 sensor chips 102. In some cases, each sensor chip comprises a plurality of electrical contacts (e.g., 1202 in FIG. 12B). One or each sensor chip also comprises an aperture region 108 with an array of nanometer-scale apertures, for example, comprising at least 1,000, at least 10,000, at least 100,000, at least 1,000,000, or at least 10,000,000 nanometer-scale apertures 202. Treatment with selective depositions provides one or more sensor chips with different surface characteristics at different portions of the aperture region.

At S508, a plurality of stacked plates 304 is mounted on the treated sensor wafer 302. A stacked plate 304 includes a plate 104 and a protective layer 308 overlaid on top of the plate 104 as illustrated in FIG. 3B. The protective layer 308 covers the opening 110 of the plate 104 to protect the aperture region of the corresponding sensor chip, for example, to prevent a processing liquid (e.g., water) from reaching the selective depositions, during one or more integration and packaging processes.

It should be noted that the number of the plurality of plates does not necessarily match the number of the plurality of sensor chips on the sensor wafer. Also, it should be noted that the plates (stacked or non-stacked) do not necessarily lineup on the sensor wafer (treated or untreated) consecutively and/or symmetrically as illustrated in FIG. 3A. Instead, the plates can be arranged on the sensor wafer intermittently, asymmetrically or irregularly. For instance, one or more sensor chips may not have a corresponding plate mounted on the top.

In some cases, the plurality of stacked plates 304 is fixedly bonded to the treated sensor wafer 302 by an adhesive including but not limited to epoxy adhesives, acrylic-ester-based adhesives, mercapto-ester-based adhesives and silicone materials. In some cases, each stacked plate 304 is aligned with a corresponding sensor chip 102 such that the opening 110 of the plate 104 is above the aperture region 108 of the corresponding sensor chip 102.

Figure 15A:
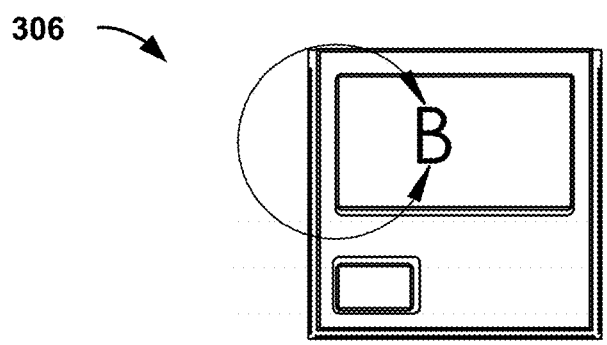
FIG. 15A is a top view schematically illustrating an exemplary plate on top of a sensor chip in accordance with some embodiments of the present invention.
Figure 15B:
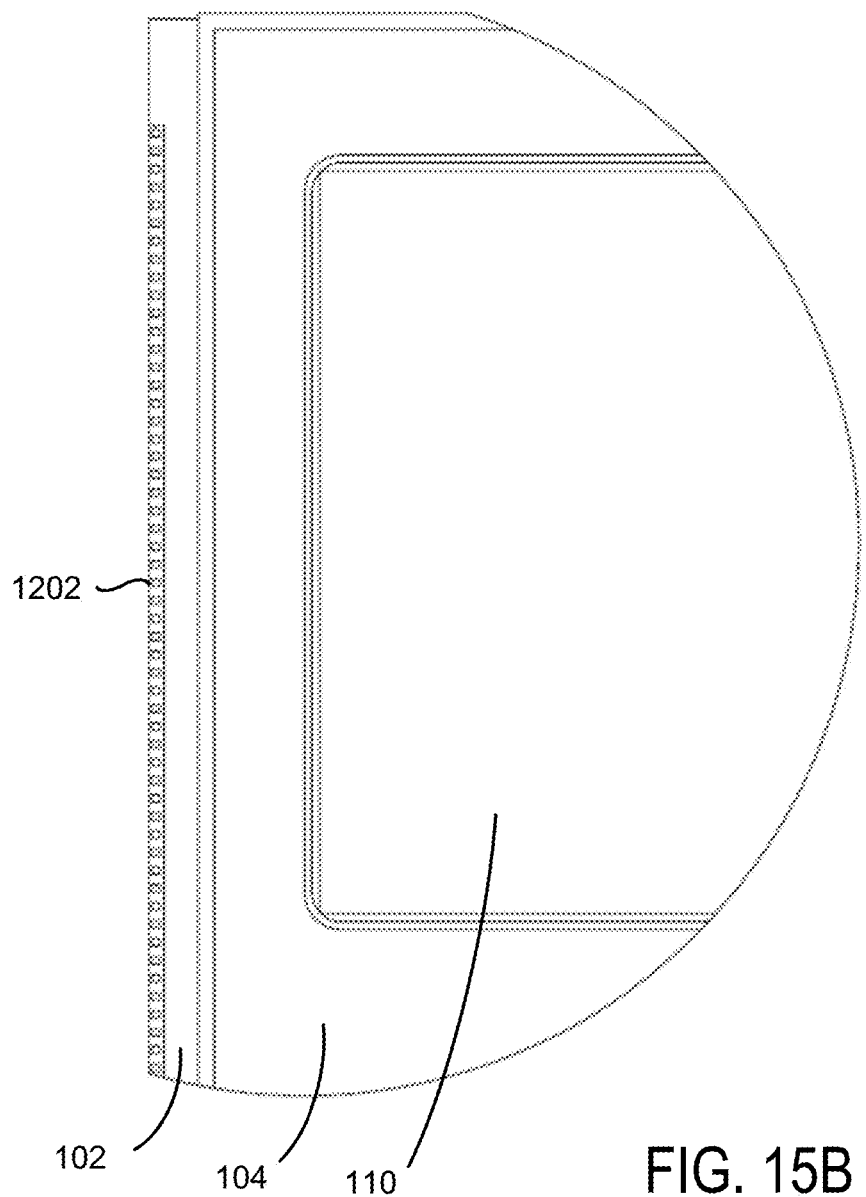
FIG. 15B is a partially enlarged view of the circle B in FIG. 15A.

With the plurality of stacked plates mounted on the sensor wafer, the sensor wafer is diced at S510 to obtain a plurality of dies 306. It should be noted that the number of dies does not necessarily need to match the number of the plurality of plates or the number of the plurality of sensor chips on the sensor wafer. In some cases, one or each die 306 comprises one sensor chip 102 and one plate 104 along with the protective layer 308 on top of the plate 104 as illustrated in FIG. 3B. In some cases, a die has a substantially square shape as illustrated in FIGS. 15A and 15B. In some cases, a die has a length that is between 10 to 15 mm, between 15 to 20 mm, between 20 to 25 mm or between 25 to 30 mm.

Figure 12A:
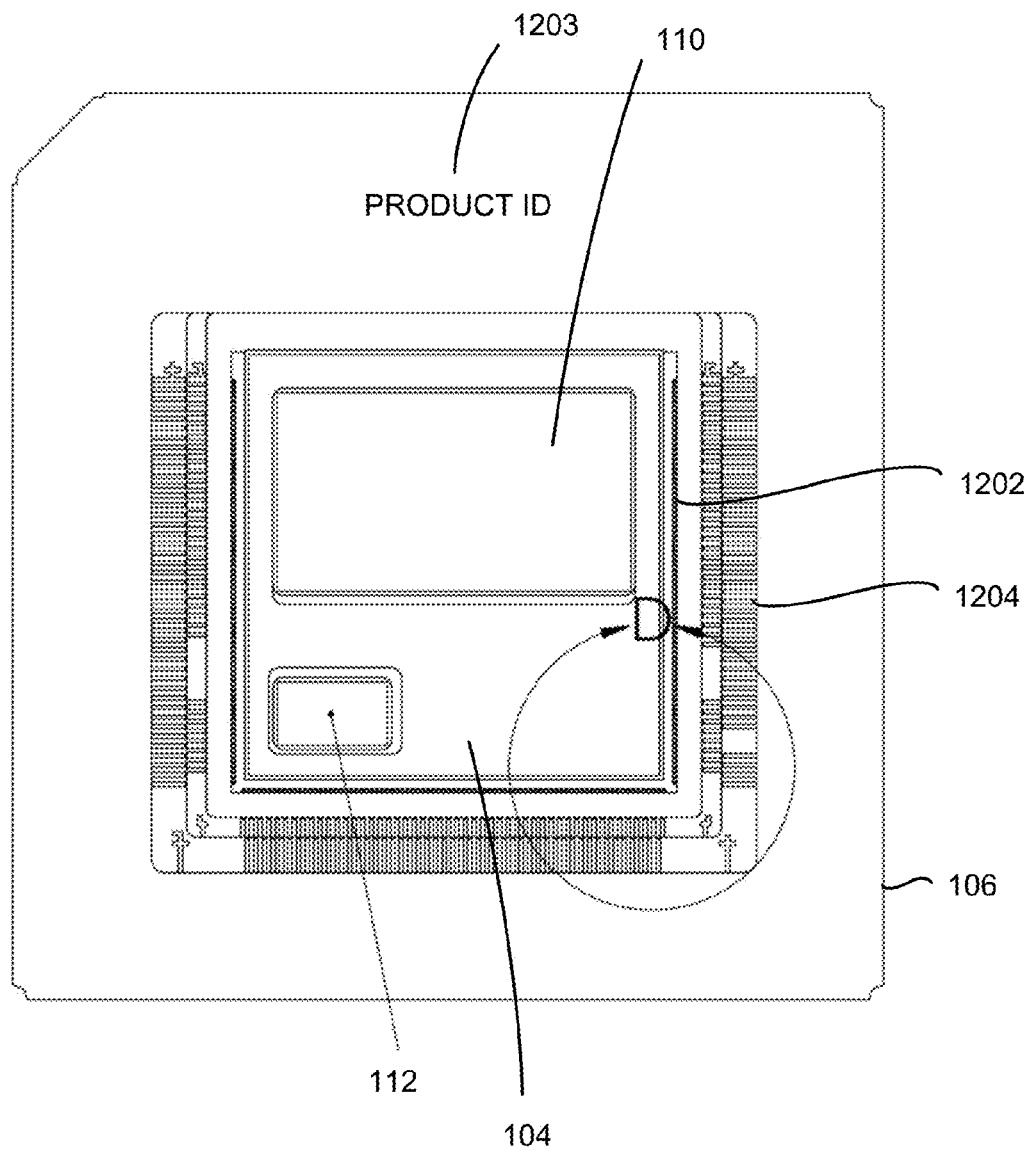
FIG. 12A is a top view schematically illustrating exemplary internal pad metallization of an analytical device package in accordance with some embodiments of the present invention.
Figure 12B:
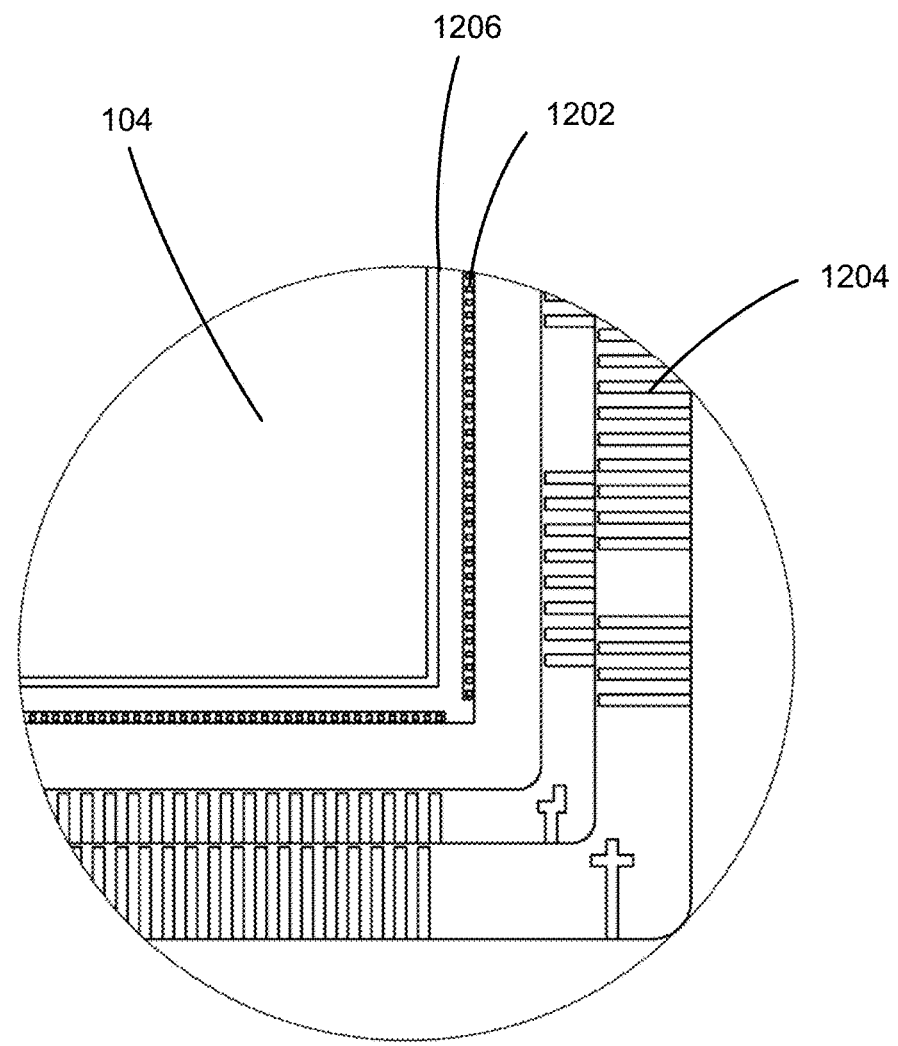
FIG. 12B is a partially enlarged view of the circle D in FIG. 12A.

At S504, a plurality of substrates 106 is provided, and each substrate has a plurality of electrical contacts to facilitate connections to other external instruments. FIGS. 12A and 12B illustrate a plurality of electrical contacts 1204 of a packaging substrate 106. Providing the plurality of substrates 106 can be conducted before, after or concurrently with any one of processes S506, S508 and S510. It should be noted that the number of the plurality of substrates provided does not necessarily need to match the number of dies, the number of the plurality of plates or the number of the plurality of sensor chips on the sensor wafer. Also, it should be noted that a plurality of substrates is provided for the purpose of making multiple analytical device packages. To make one analytical device package, only one substrate is necessary.

In some cases, the packaging substrate 106 is made of a material comprising alumina ceramic, aluminum nitride or the like. In some cases, the packaging substrate 106 has a substantially square shape, and is formed with a recess 128 to accommodate at least a portion of the die as illustrated for example in FIGS. 1A and 3A. In such cases, the packaging substrate is relatively thinner at the recess than at one or more edges. This configuration is advantageous. For example, on the one hand, the relatively smaller thickness at the recess allows for magnetic bead loading. On the other hand, the relatively larger thickness at one or more edges provides mechanical strength (e.g., clamping) when performing integration and packaging processes such as attaching a die to the packaging substrate, removing the protective layer from the plate of the die or connecting the electrical contacts. In some cases, the packaging substrate at the recess has a thickness that is at most 1.0 mm and the packaging substrate at one or more edges has a thickness that is at least 2.0 mm.

At S514, a die 306 is attached to a packaging substrate 106. In some cases, a die 306 is attached to each of the plurality of substrates 106. Then at S516, the electrical contacts of the sensor chip (e.g., 1202 in FIGS. 12B and 16) is electrically connected with the electrical contacts of the packaging substrate (e.g., 1204 in FIGS. 12B and 16), for example, by wires pads, solder bonds, gold compression bonding or any combination thereof (e.g., 312 in FIGS. 3A and 16). In some cases, aluminum wires are used for connecting the electrical contacts.

At S518, the protective layer 308 is removed from the plate 104 of the die 306 to expose the aperture region 108 of the sensor chip 102. Removing the protective layer (S518) can be conducted either before or after connecting the electrical contacts (S516). In some cases, whether to remove the protective layer before or after connecting the electrical contacts depends on the processes used for connecting the electrical contacts. For example, in cases where connecting the electrical contacts is conducted at a room temperature range (e.g., between 10 to 20° C., between 20 to 30° C., or between 30 to 40° C.), no additional cleaning process (e.g., plasma cleaning) is needed after electrical bonding. Accordingly, removing the protective layer is preferably conducted before connecting the electrical contacts. On the other hand, in cases where connecting the electrical contacts is conducted at an elevated temperature (e.g., 100° C. or above), a plasma cleaning process is normally performed before connecting the electrical contacts. It should be noted that a plasma cleaning process is customary and is not always necessary for cases where connecting the electrical contacts is conducted at an elevated temperature. In such cases, removing the protective layer is preferably conducted after connecting the electrical contacts to protect the aperture regions of the sensor chip from the plasma.

In some embodiments, the exemplary method 300 for the fabrication of analytical device packages includes additional, optional or alternative processes. For instance, in some cases, the exemplary method 300 includes inspection processes such as S512 that inspects quality of a die prior to attaching the die to a packaging substrate. In some cases, the exemplary method 300 also includes a process such as S502 that prints, inscribes or attaches a product identification on a packaging substrate as illustrated in FIG. 5. Printing, inscribing or attaching the product identification can be conducted prior to attaching a die to the packaging substrate. The product identification (e.g., 1203 in FIG. 12A) can be a barcode, a tag, a product name, a chip identifier, a company logo, a series number or other identifiers or a combination of identifiers, and can be located in any suitable place. In some cases, an identifier such as a chip identifier is programed to a sensor chip or each sensor chip, for example, using an on-chip memory.

Figure 6A:
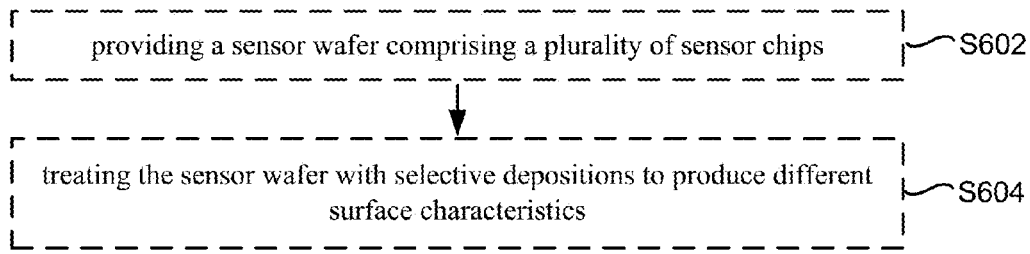
FIGS. 6A, 6B and 6C are flow charts illustrating some alternative, additional or optional processes for the fabrication of analytical device packages in accordance with some embodiments of the present invention.

FIGS. 4A-4C and 6A-6C illustrate additional, optional or alternative processes that can be implemented into the first exemplary method 300. For instance, FIG. 6A illustrates alternative processes to S506. As shown, instead of providing a treated sensor wafer 302, i.e., a sensor wafer that has been treated with selective depositions, the method includes a process S602 that provides an untreated sensor wafer. The untreated sensor wafer includes a plurality of sensor chips, and each sensor chip includes a plurality of electrical contacts and an aperture region with an array of nanometer-scale apertures. The method further includes a process S604 that treats the sensor wafer with selective depositions to produce different surface characteristics at different portions of the aperture region. As an example, different surface characteristics at different portions of the aperture region can be produced by exposing a surface of the sensor wafer having both silica-based portions and metal or metal oxide portions to an agent that preferentially binds to the metal or metal oxide portions to produce passivated metal or metal oxide portions of the surface, and exposing the surface of the sensor wafer to a silica functionalizing agent that binds to both the silica-based portions and the passivated metal or metal oxide portions of the surface, then rinsing the surface of the packaging substrate. As another example, different surface characteristics at different portions of the aperture region can be achieved by treating a surface of the sensor wafer having both silica-based portions and metal or metal oxide portions with a compound comprising phosphate or phosphonate groups to produce passivated metal or metal oxide portions of the surface, and treating the surface of the sensor wafer with a silica functionalizing agent that binds to both the silica-based and the passivated metal or metal oxide portions of the surface. Other methods including those disclosed in U.S. Pat. Nos. 8,501,406 and 8,802,600 can be used to treat the sensor wafer with selective depositions to produce different surface characteristics at different portions of the aperture region. The contents of U.S. Pat. Nos. 8,501,406 and 8,802,600 are hereby incorporated by reference in their entireties, and their described methods can be used in any combination with the methods described herein.

In some cases, treatment with the selective depositions produces a first surface characteristic on a base of at least one nanometer-scale aperture in at least one sensor chip and a second surface characteristic on a side wall or a top of the at least one nanometer-scale aperture in the at least one sensor chip. In certain embodiments, the first surface characteristic is different from the second surface characteristic. In some cases, the first surface characteristic has a transparent portion that is bound with sufficient coupling agent for binding a desired molecule to be analyzed, and the second surface characteristic has an opaque or reflective portion that is either coated with a passivating compound, having no coupling agent or having very low levels of coupling agent. For instance, FIGS. 2A and 2B illustrate the base of the nanometer-scale aperture 202 having a first surface characteristic that can be used to attach a desired molecule (molecule of interest) 212 and the side wall or the top surface of the nanometer-scale aperture 202 being passivated and thus having a second surface characteristic. In FIGS. 2A and 2B, the second surface characteristic is different from the first surface characteristic.

In some cases, one or more of the integration and packaging processes are conducted in an environment that does not degrade or compromise the selective depositions. For instance, attaching a die to the packaging substrate, removing the protective layer from the plate of the die and/or connecting the electrical contacts are conducted in an environment having a condition that preserves the selective depositions. The condition includes without limitation (and in any combination) humidity of the environment, processing temperatures and/or UV exposures, to which the sensor chip or other components are exposed. In one case, the humidity of the environment to which the sensor chip is exposed is at most 65% relative humidity for 48 hours, at most 50% relative humidity for 48 hours, or at most 35% relative humidity for 48 hours. The processing temperature (e.g., for bonding electrical contacts, or thermal cure of adhesives) does not exceed a certain temperature for example approximately 150° C. The UV exposure (e.g., cure of adhesives) does not exceed a certain amount for example approximately 10000 mJ/cm$^2$. It should be noted that appropriate processing temperature range, humidity range and/or other conditions depend on the selective depositions used in treatment of the sensor wafer, and the ranges disclosed herein are exemplary and non-limiting. In addition, in some cases, the processing temperature and the UV exposure are interdependent. For instance, if a process is conducted at a relatively lower processing temperature, it may be desirable to have this or other processes performed with a relatively higher UV exposure so long as the combined effect of the processing temperature and the UV exposure does not compromise the selective depositions. Likewise, if a process is conducted with a relatively lower UV exposure, it may be desirable to have this or other processes performed at a relatively higher processing temperature so long as the combined effect of the processing temperature and the UV exposure does not compromise the selective depositions.

Figure 4A:
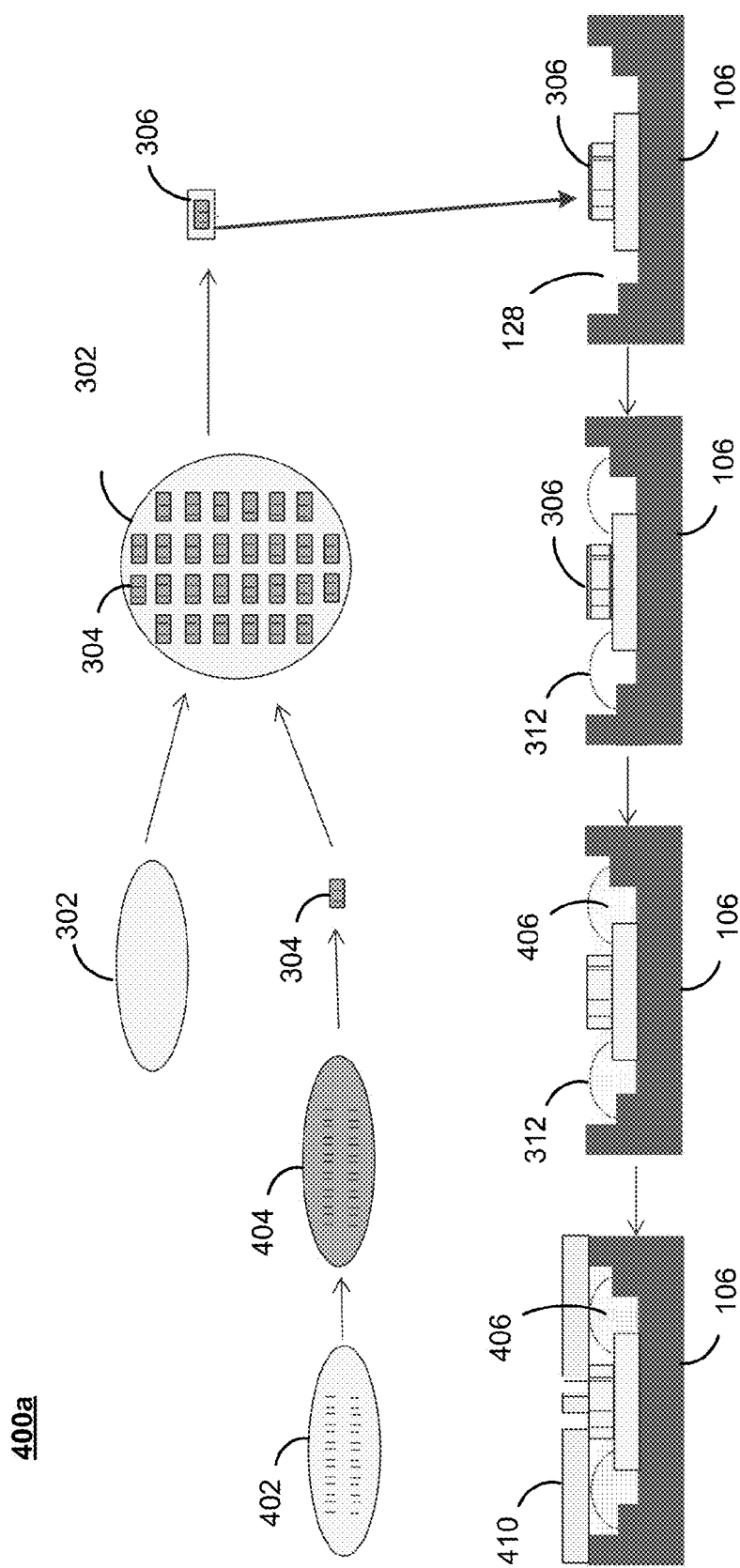
FIGS. 4A, 4B and 4C are block diagrams illustrating modifications of the first exemplary method including some alternative, additional or optional processes in accordance with some embodiments of the present invention.
Figure 4B:
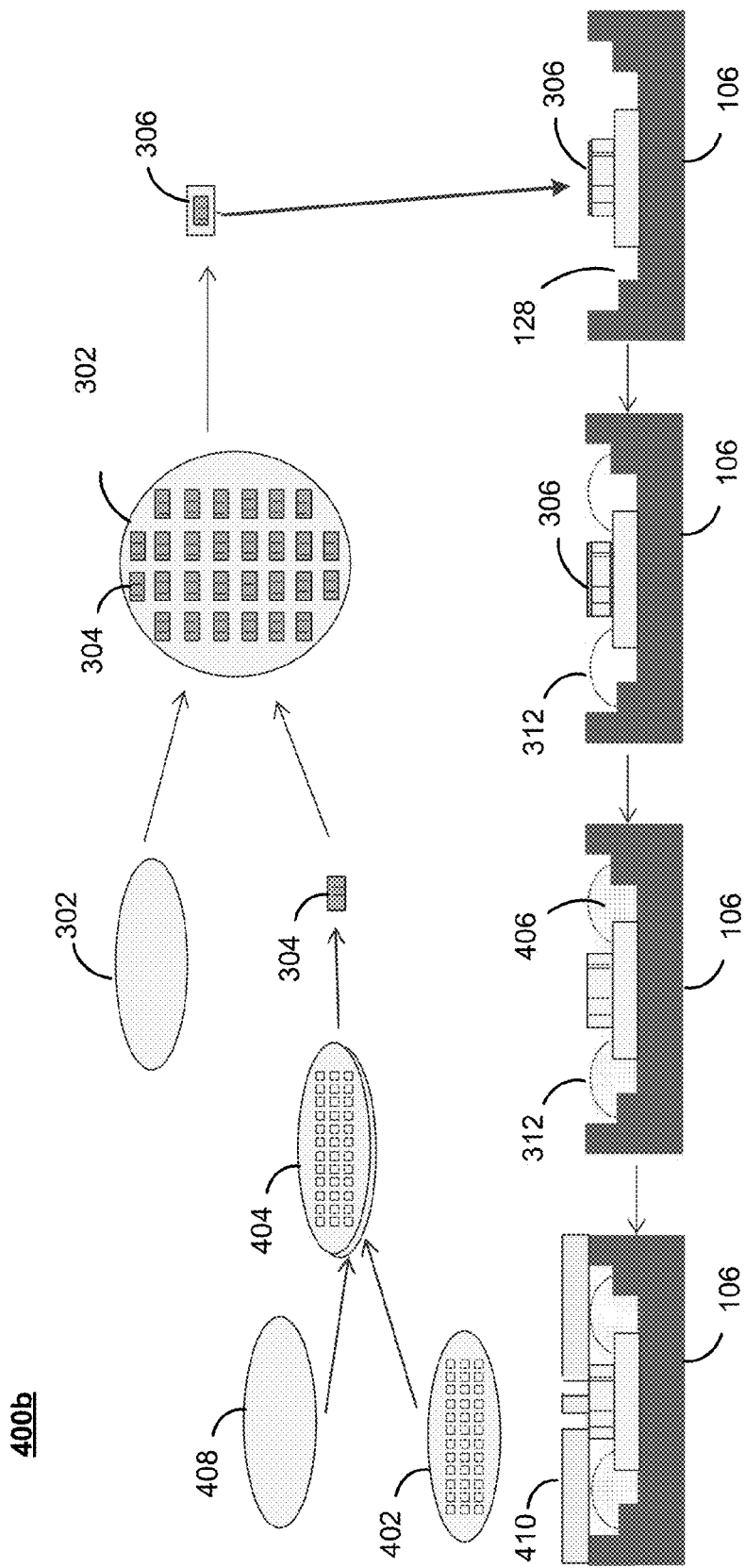
Figure 6B:
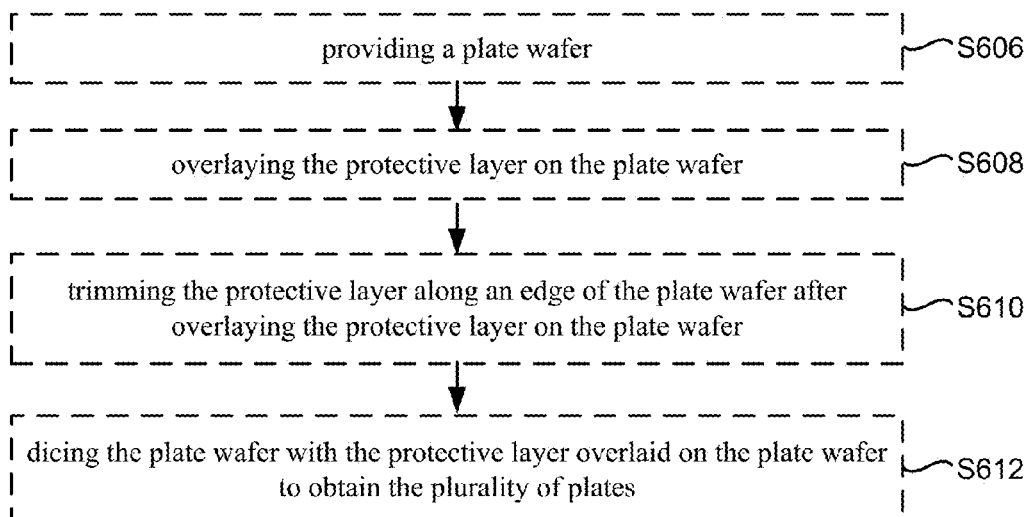

FIGS. 4A, 4B and 6B illustrate modification of the first exemplary method including exemplary processes for producing a plurality of plates with a protective layer overlaid on top of a plate. As illustrated, after providing a plate wafer 402 at S606, a protective layer 308 is overlaid over the plate wafer 402 at S608. The stacked plate wafer 404, e.g., the plate wafer 402 with the protective layer 308 on top, is then diced at S612 to obtain a plurality of stacked plates 304. In some cases, an optional trimming process S610 is performed to trim the protective layer along an edge or edges of the plate wafer 402. The optional trimming process is performed after overlaying the protective layer on the plate wafer but prior to dicing the stacked plate wafer. In an alternative method, the plate wafer 402 is diced without a protective layer overlaid on top to obtain a plurality of plates 104. In such an alternative method, a protective layer 308 is attached to the individual plate 104 before it is mounted to the sensor wafer.

Figure 4C:
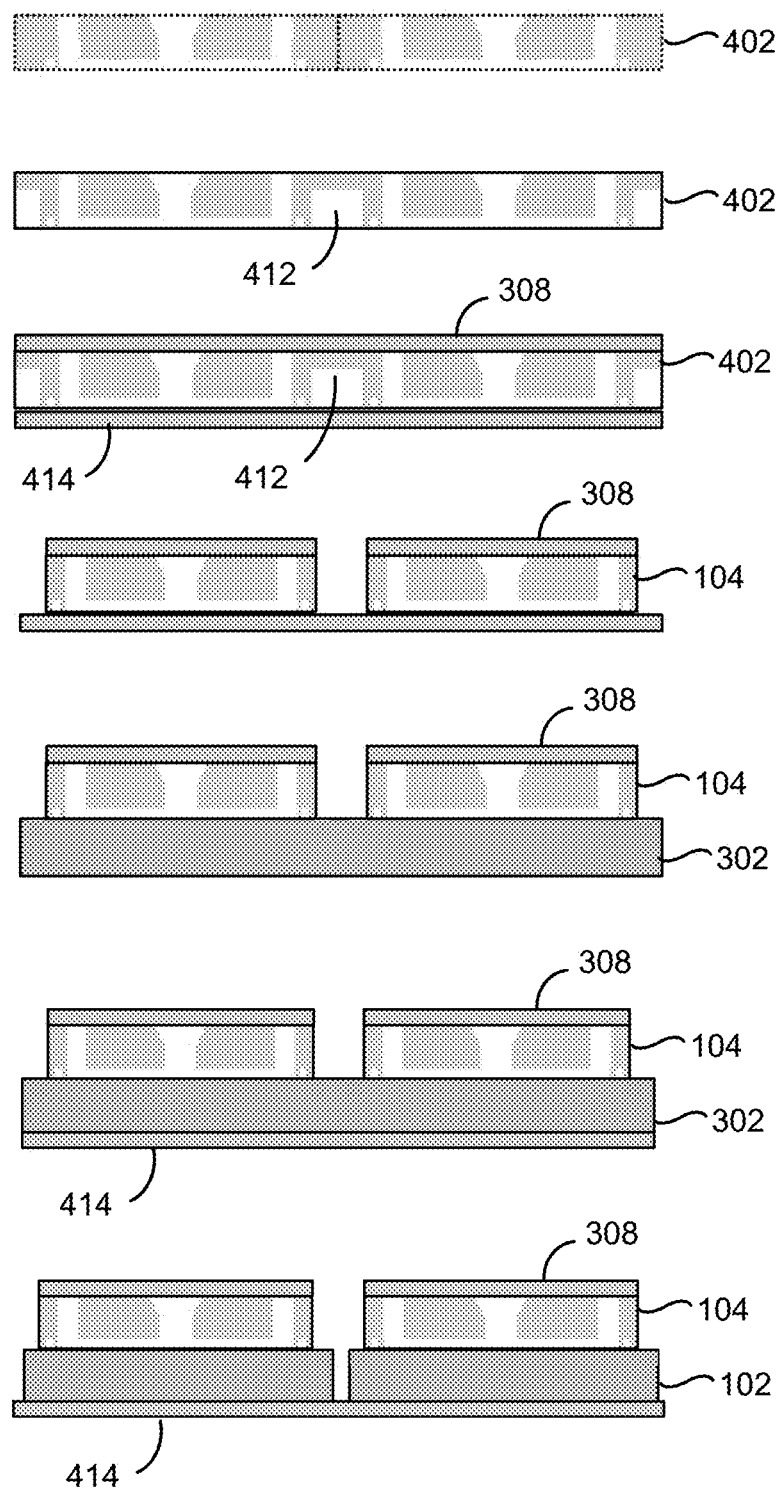

In some cases such as the embodiment illustrated in FIG. 4C, prior to overlaying the protective layer 308 over the plate wafer 402, the plate wafer 402 is diced or partially diced to obtain bonding pad grooves 412. In such embodiments, after the bonding pad grooves 412 are formed, the protective layer is overlaid over the plate wafer 402, for example, on a side opposite to where the bonding pad grooves are formed as illustrated in FIG. 4C. In some cases, a dicing tape 414 is applied to the plate wafer for securing the plate wafer while dicing the plate wafer.

The plate wafer can be made of a variety of materials including but not limited to plastic, metal, plastic with metal inserts, plastic with surface metallization coating, or metal with passivation. In some cases, the plate wafer is made of silicon, glass or aluminum. In some cases, the protective layer is a tape or a foil laminated on the plate wafer. In some cases, the protective layer is a sacrificial glass wafer 408 bonded onto the plate wafer as illustrated in FIG. 4B.

Figure 6C:
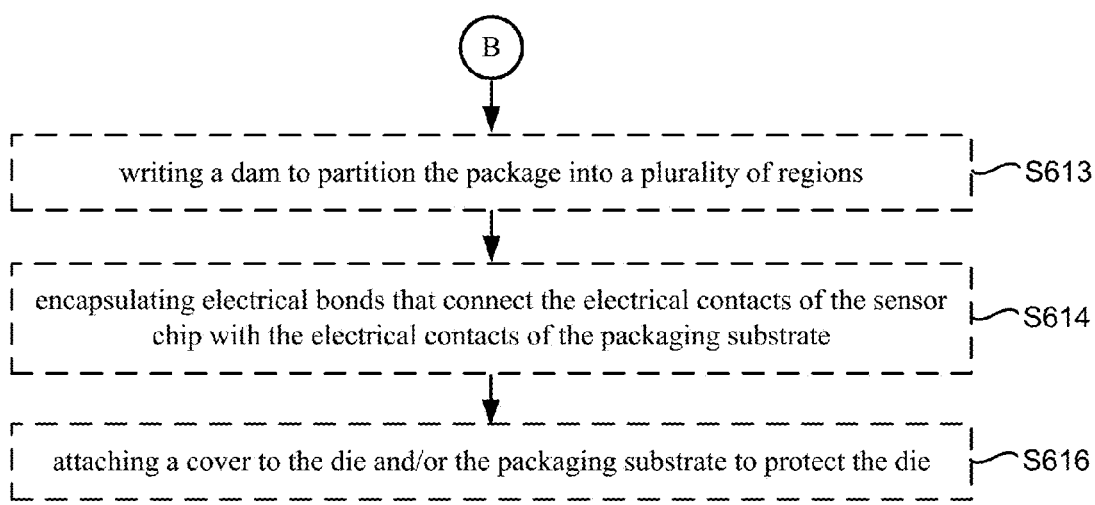

FIGS. 4A, 4B and 6C illustrate modification of the first exemplary method including additional or optional processes for protecting electrical bonds 312 and/or electrical contacts 1202, 1204 and for protecting the die. At S614, electrical bonds 312 that connect the electrical contacts 1202 of the sensor chip 102 with the electrical contacts 1204 of the packaging substrate 106 are encapsulated. Encapsulant 406 includes but is not limited to silicone encapsulants, UV cure materials and epoxy materials can be used for encapsulation. In some cases, the encapsulant covers and protects the electrical bonds 312 as well as the electrical contacts 1202 of the sensor chip 102 and the electrical contacts 1204 of the packaging substrate 106. In some cases, the encapsulant fills the package cavities and covers all the electrical contacts, wire bonds and die pads, protecting them from moisture. At S616, a cover 410 is attached or mounted to the die 306 and/or the packaging substrate 106. The cover 410 protects the die 306 and facilitates introduction of fluidic samples to the aperture region 108 of the sensor chip 102. In some cases, the cover is configured to perform one or more of the following functions: forming an upper portion of fluidic well after assembled, being an interface to an instrument robot for picking and handling the package when in use, protecting the electrical contacts and creating a seal for oxygen exclusion when interfacing with an instrument. In one case, encapsulation is conducted prior to attaching the cover to the die and/or the packaging substrate. In another case, encapsulation is conducted after the cover is attached to the die and/or the packaging substrate.

In some embodiments, before encapsulating the electrical bonds 312 and/or electrical contacts 1202, 1204, the method further includes writing a dam at S613 to partition the package, produced by attaching a die to a packaging substrate, or a portion of the package into a plurality of regions. Writing a dam can be achieved, for example, using jetting and dispensing methods or systems. A region partitioned by the dam can be selectively filled with a specific filling material (e.g., encapsulant), or left unfilled. An unfilled region can be used, for example, as an access to the external environment or as a port for coupling with the external environment. The dam can also serve as a barrier to keep a region (e.g., a region with an optical component) free from encapsulation.

The dam partitions the package into a plurality of regions includes a first region. In some cases, at least a portion of the electrical bonds, the electrical contacts of the sensor chip, or the electrical contacts of the packaging substrate resides in the first region, and the encapsulating of the electrical bonds fills at least partially the first region with a first filling material. In an embodiment, the dam is written to fill a gap between the top plate and the substrate, and serves as a barrier to keep a second region in the plurality of regions free from encapsulation during the encapsulating of the electrical bonds that fills at least partially the first region. In an embodiment, the plurality of regions includes a third region, and the encapsulating of the electrical bonds fills at least partially the third region with a material the same as or different from the first filling material.

By way of example, FIG. 19A illustrates a package 1900 including the substrate 106, the top plate 104 and the sensor chip 102 between the substrate 106 and the top plate 104. The package includes electrical contacts and/or bonds (e.g., 312, 1202, 1204) that need protection. For illustration purposes, FIG. 19A illustrates electrical contacts and/or bonds on three sides. FIG. 19B illustrates a dam 1902 written on the package, partitioning the package (or a portion of the package) into two regions 1904, 1906. In the illustrated embodiment, electrical contacts and/or electrical bonds are resided in region 1906. In some cases, the dam 1902 is written to fill the gap between the top plate and the substrate, and serve as a barrier to keep the region 1904 free from encapsulation while encapsulating the region 1906. FIGS. 19C-19E are top, perspective and cross-sectional views, illustrating fill of encapsulant 406 in the region 1906.

The dam can be written on any surface (planar or non-planar) within the package and can be of any shape or size. The dam can have uniform or non-uniform height, and uniform or non-uniform width. A plurality of dams of same or different shapes or sizes can also be written within one package. One package can be partitioned in any number of regions, and any number of selected regions can be filled with the same or different materials. Partitioning of packages is disclosed in U.S. Pat. No. 8,148,808, the contents of which are hereby incorporated by reference herein in their entirety.

Figure 1A:
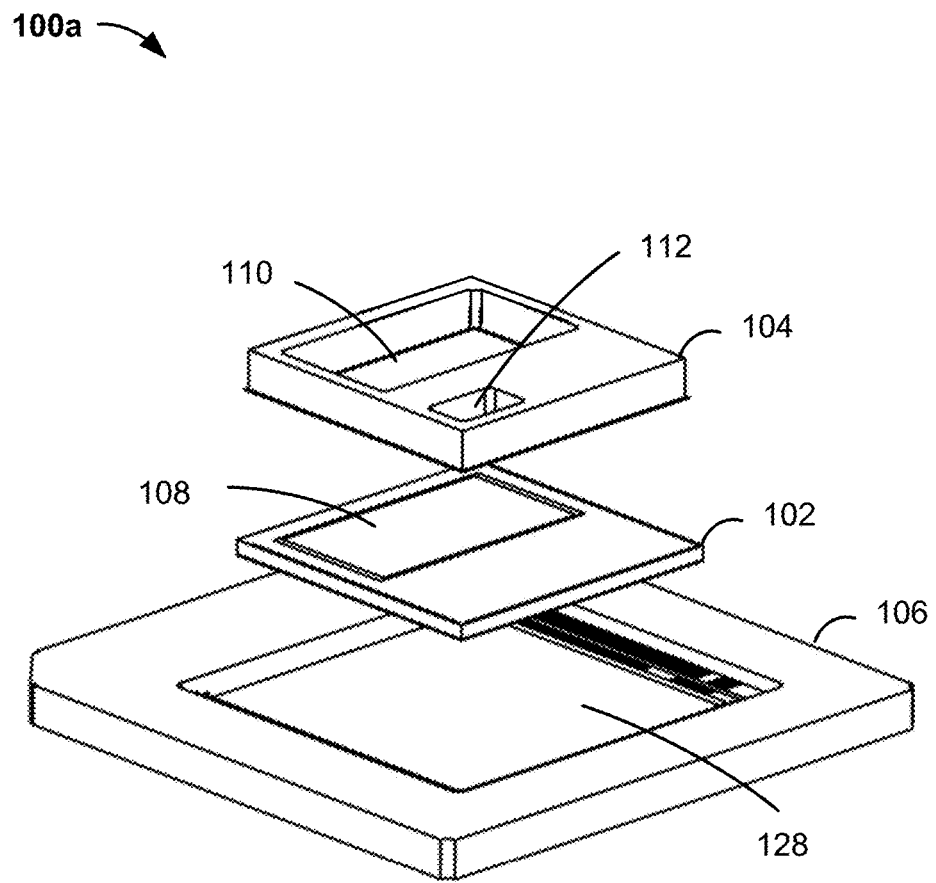
FIG. 1A is an exploded perspective view schematically illustrating an exemplary analytical device package in accordance with some embodiments of the present invention.
Figure 1B:
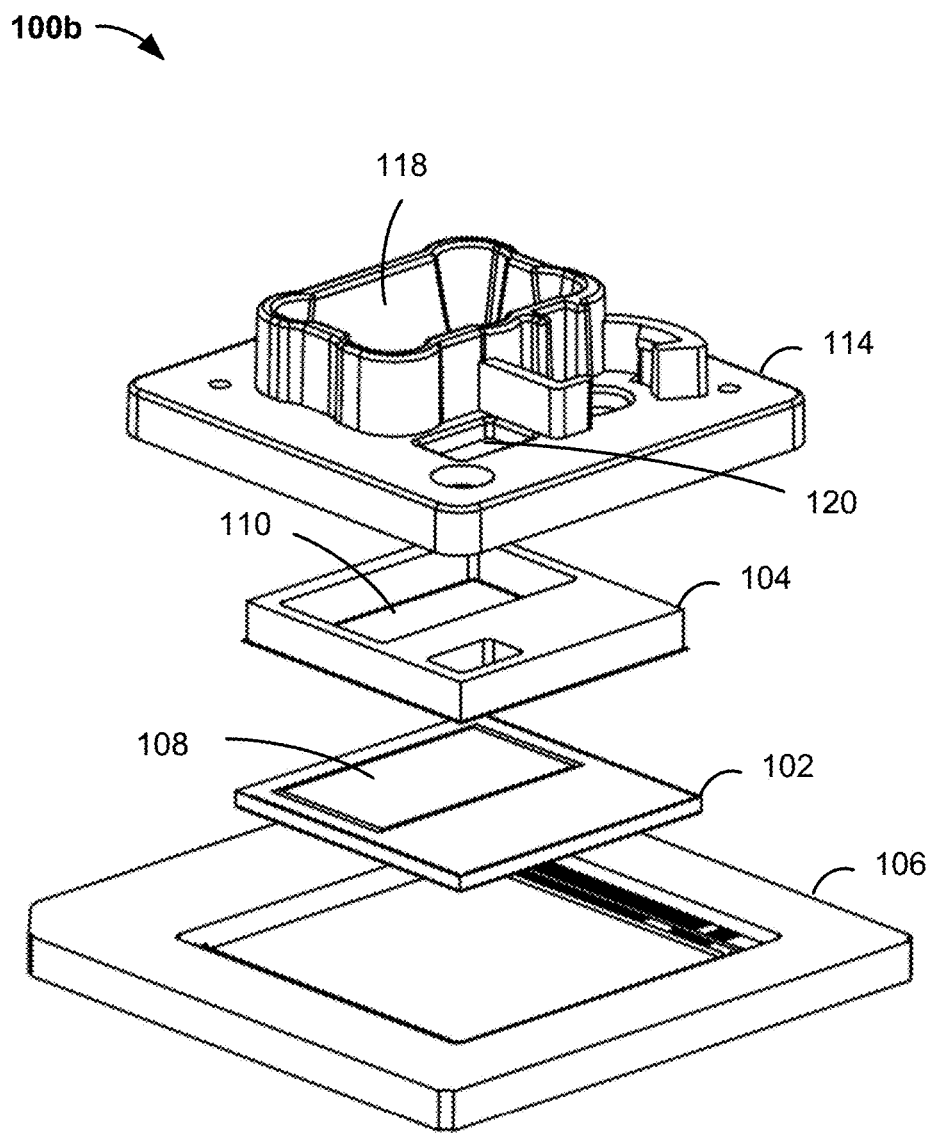
FIG. 1B is an exploded perspective view schematically illustrating a first modification of the exemplary analytical device package in FIG. 1A, including some alternative, additional or optional components in accordance with some embodiments of the present invention.
Figure 1C:
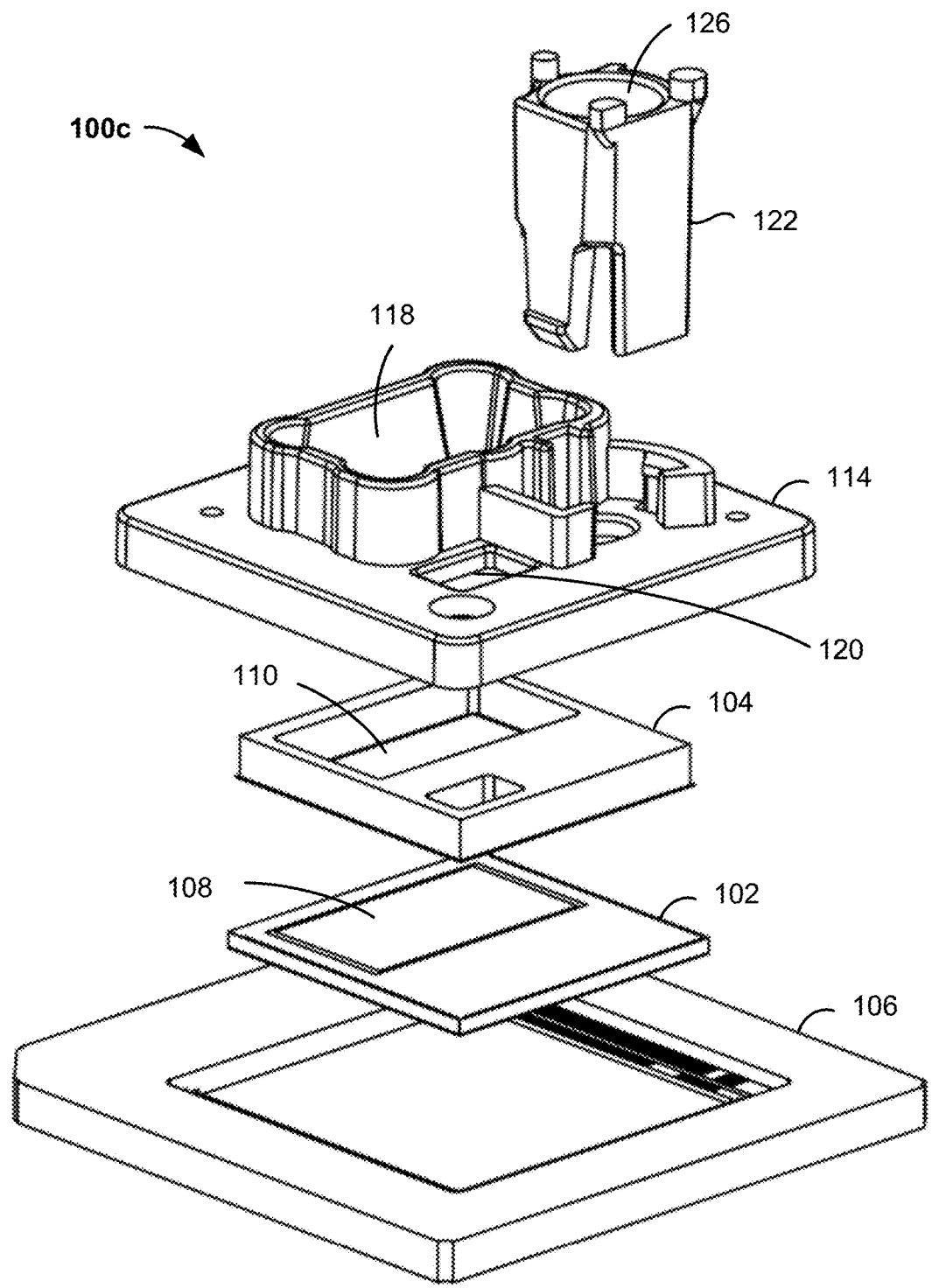
FIG. 1C is an exploded perspective view schematically illustrating a second modification of the exemplary analytical device package in FIG. 1A, including some alternative, additional or optional components in accordance with some embodiments of the present invention.
Figure 1D:
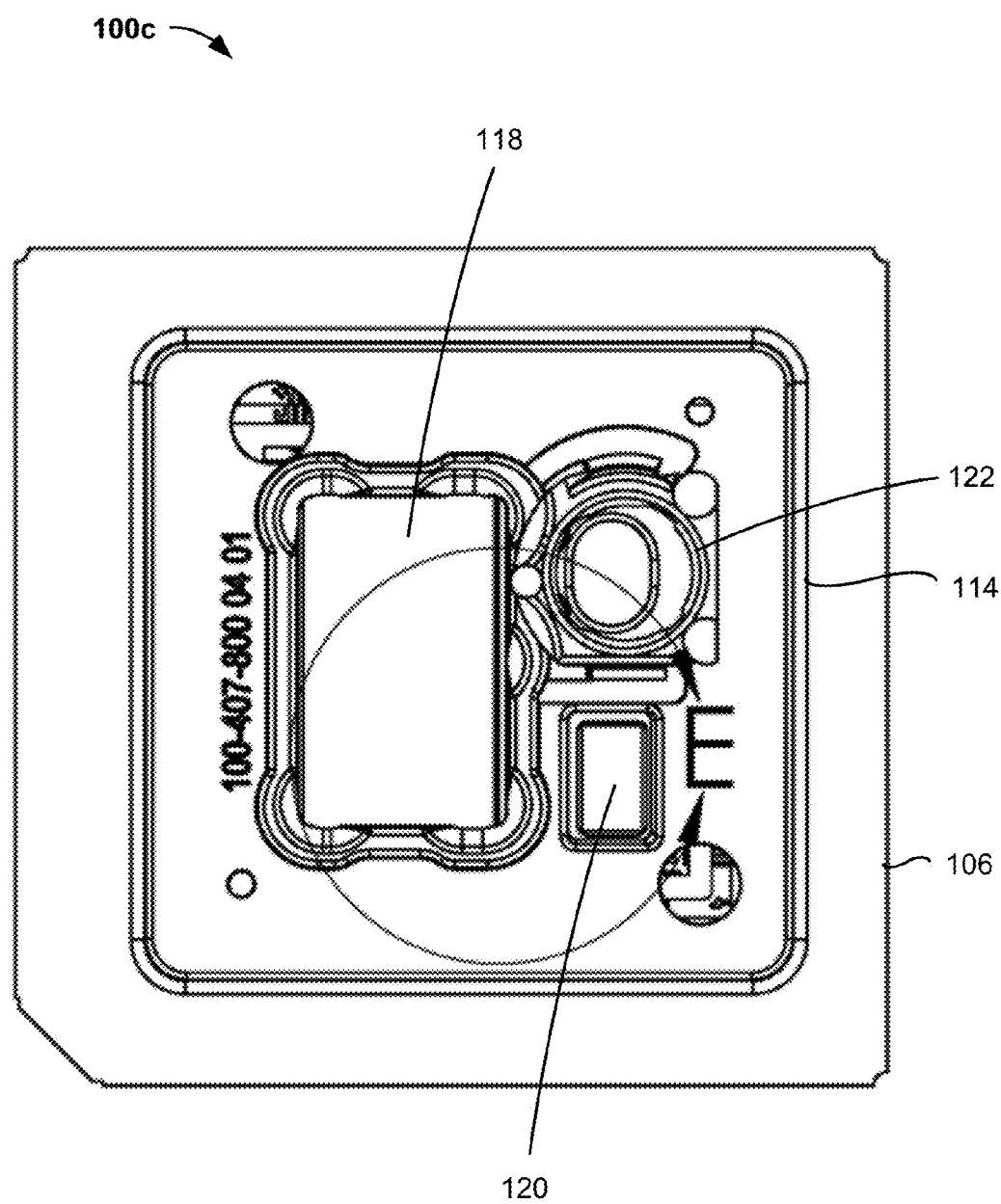
FIG. 1D is a top view of the analytical device package illustrated in FIG. 1C.
Figure 1F:
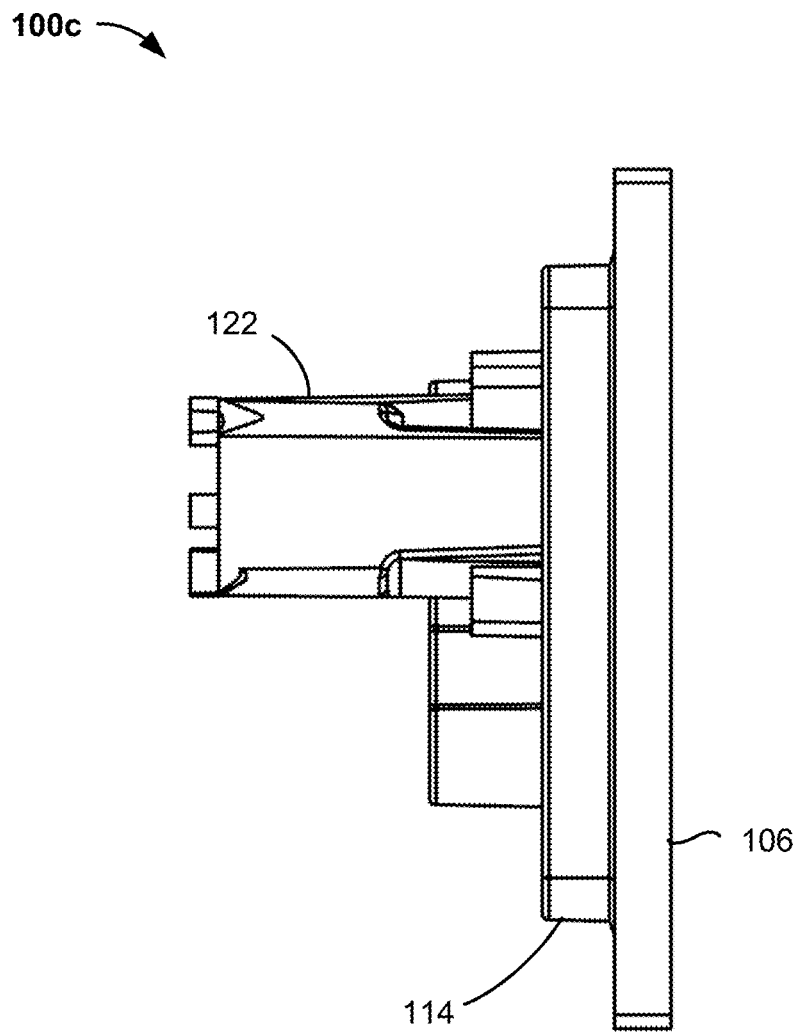
FIG. 1F is a side view of the analytical device package illustrated in FIG. 1C.
Figure 1G:
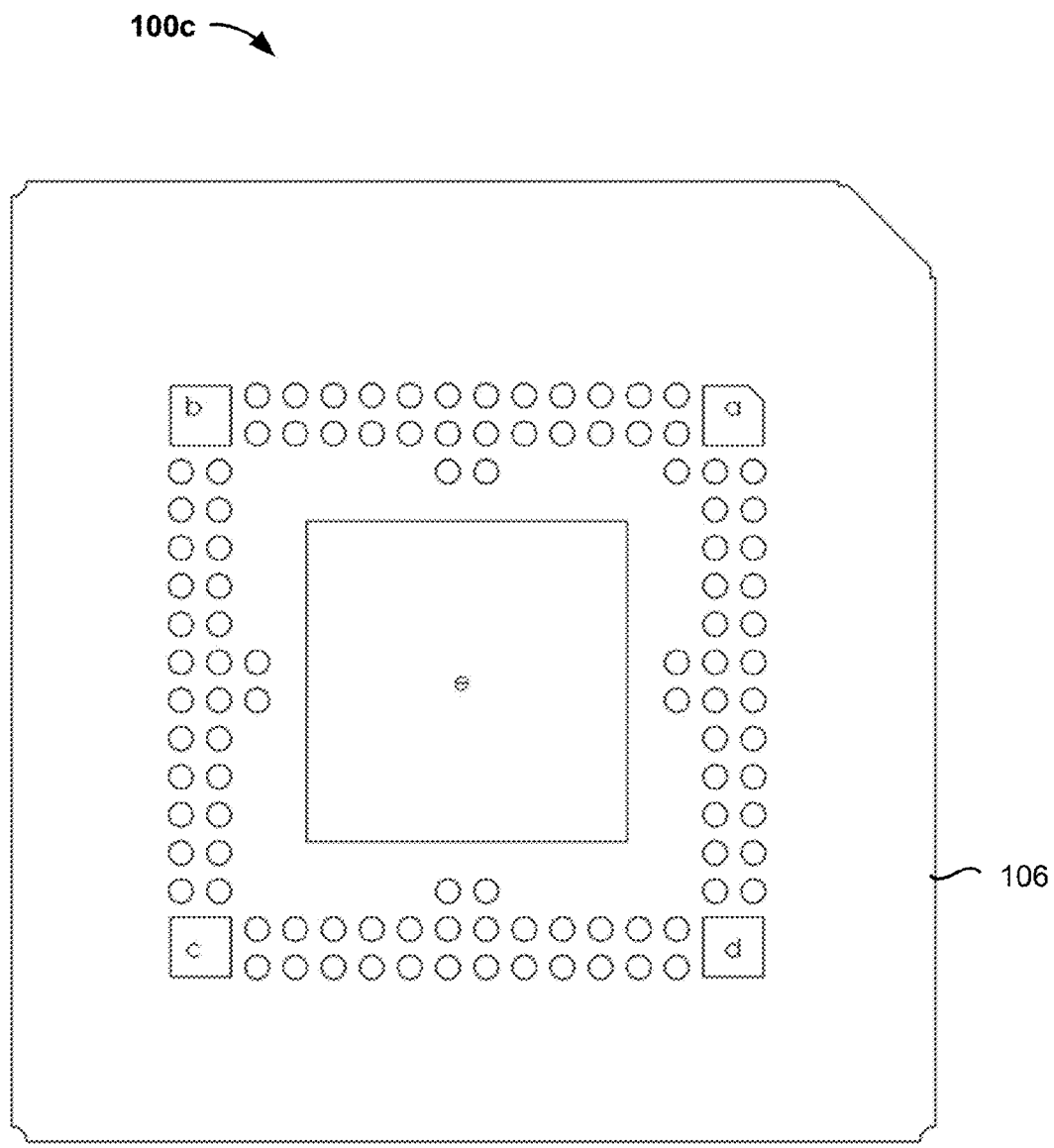
FIG. 1G is a bottom view of the analytical device package illustrated in FIG. 1C.

In some cases, the cover 410 includes a base, such as the base 114 illustrated in FIGS. 1A and 1B. The base is formed with one or more of a fluid inlet port, a fluid outlet port and an optical port. By way of illustration, FIGS. 1A and 1B show the base 114 formed with a fluid port 118 and an optical port 120, with the fluid port 118 serving as both fluid inlet and outlet ports. It should be noted that the base can be formed with separated fluid inlet and outlet ports. The fluid inlet and outlet ports are fluidly connected to the opening 110 of the plate 104. The optical port 120 is configured for coupling with an elimination light source such as a laser for introducing illumination light to the array of the nanometer-scale apertures. In some cases, the cover 410 further includes a top, such as the top 122 illustrated in FIGS. 1C-1G. The top is fixedly coupled to the base or monolithically formed with the base. In some cases, the top is formed with a port. By way of illustration, FIGS. 1C-1G shows the top 122 with a port 126. The cover including the base and/or the top can be made of a material that is compatible with the fluidics and biochemistry. For instance, in some cases, the base is made of a material comprising Acrylonitrile Butadiene Styrene (ABS) or the like, and the top is made of a material comprising polypropylene or the like. In some cases, the cover is made of a hydrophobic material to help pin aqueous fluid to the plate.

Figure 7:
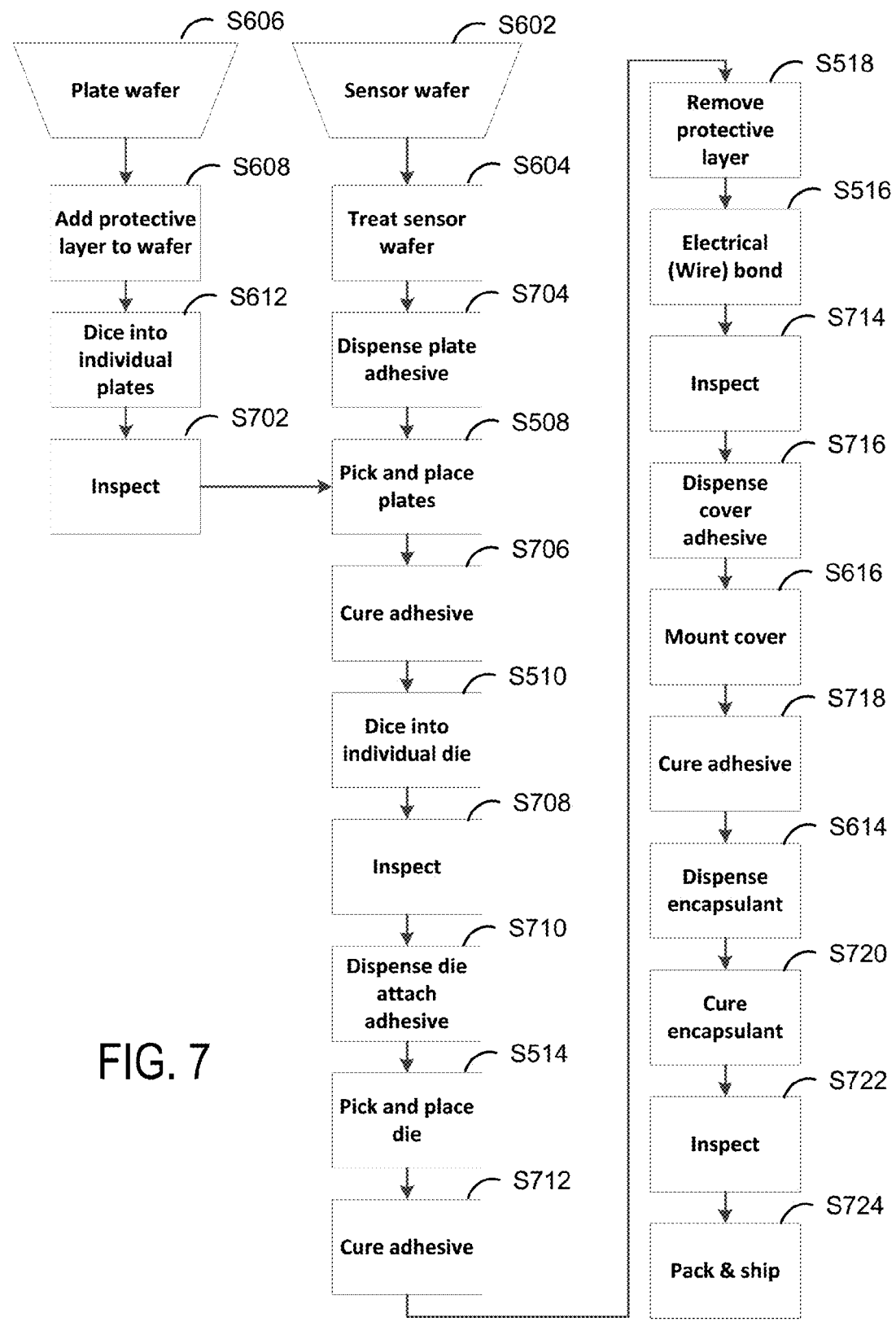
FIG. 7 is a flow chart illustrating an example of the first exemplary method for the fabrication of analytical device packages in accordance with some embodiments of the present invention.

Referring now to FIG. 7, there is depicted an example of a first exemplary method for the fabrication of analytical device packages in accordance with some embodiments of the present invention. As illustrated, a plate wafer such as plate wafer 402 is provided at S606 and a protective layer such as protective layer 308 is added to (e.g., overlaid on) the plate wafer at S608. Then, the plate wafer along with the protective layer is diced at S612 to obtain a plurality of individual plates with the protective layer on top (e.g., stacked plate 304). The individual plates with the protective layer on top are inspected at S702, for example to discard any plates that do not meet the requirements or specifications. In certain embodiments, an untreated sensor wafer is provided at S602 and treated at S604 with selective depositions to produce different surface characteristics at different portions of the aperture region. At S704, a first adhesive for mounting the plate to the sensor wafer is dispensed onto the sensor wafer. Then, the stacked plates are picked and mounted on the sensor wafer at S508. The first adhesive is cured at S706, for example by plasma cures, UV cures, thermal cures in different environments such as Ar/H2 and N2, catalytic cures (e.g., room temperature cured materials using a catalyst) or any combinations of these cures. After the first adhesive is cured, the sensor wafer is diced at S510 into a plurality of dies (e.g., die 306). The dies are inspected for qualities at S708. A second adhesive is dispended into a packaging substrate (e.g., substrate 106) at S710 and a die is picked and placed to the packaging substrate at S514. Then the second adhesive is cured at S712, for example by thermal cure. The protective layer is removed at S518, and electrical bonding is conducted at S516 to connect the electrical contacts of the sensor chip with the electrical contacts of the packaging substrate. An inspection is performed at S714, for example to check the electrical bonding and/or adhesives. A third adhesive is dispensed onto the plate and the packaging substrate at S716 and a cover (e.g., base 114, or base 114 and top 122) is mounted onto the plate and the packaging substrate at S616. The third adhesive is cured at S718, for example by UV cure. An encapsulant is dispensed at S614 to cover the electrical bonding and/or the electrical contacts of the sensor chip and the packaging substrate. The encapsulant is cured at S720, for example at a room temperature over a certain period of time. The resulted analytical device package is inspected at S722, and packed and/or shipped at S724.

In some cases, the first adhesive is an epoxy adhesive, acrylic-ester-based adhesive, mercapto-ester-based adhesive, a silicone material, or any combination of these materials. In some case, the second adhesive is a thermally conductive adhesive such as silver filled epoxy. In some cases, the third adhesive is the same as the first adhesive.

It should be noted that the processes illustrated in FIG. 7 are not necessarily fixed in a particular order. As an example, removing the protective layer at S518 can be performed after electrical bonding of the electrical contacts at S516. In some cases where electrical bonding is conducted at an elevated temperature, removing the protective layer at S518 is preferably conducted after the electrical bounding. As another example, dispensing encapsulant at S614 and curing encapsulant at S720 can be conducted before dispensing the third adhesive at S716 and mounting the cover at S616 onto the plate and the packaging substrate.

Also, it should be noted that some processes illustrated in FIG. 7 are additional or optional processes. As an example, inspection process at S702 may not be necessarily needed after dicing the plate wafer into individual plates at S612. For instance, inspection of the plate can be done concurrently with inspection of the die at S708. As another example, packing and shipping the analytical device package at S724 may not be necessarily needed. For instance, the analytical device package may be used in house for testing or other purposes.

Further, the method illustrated in FIG. 7 may include other alternative, additional or optional processes. As an example, to assist in mounting the plate onto the sensor wafer, a mounting tape may be placed at the bottom side of the plate before the plate is placed onto the sensor wafer at S508. As another example, to assist the removal of the protective layer, the protective layer may be exposed to an UV light for a short period of time so that the protective layer is delaminated or loosen from the plate before being removed at S518.

Figure 8A:
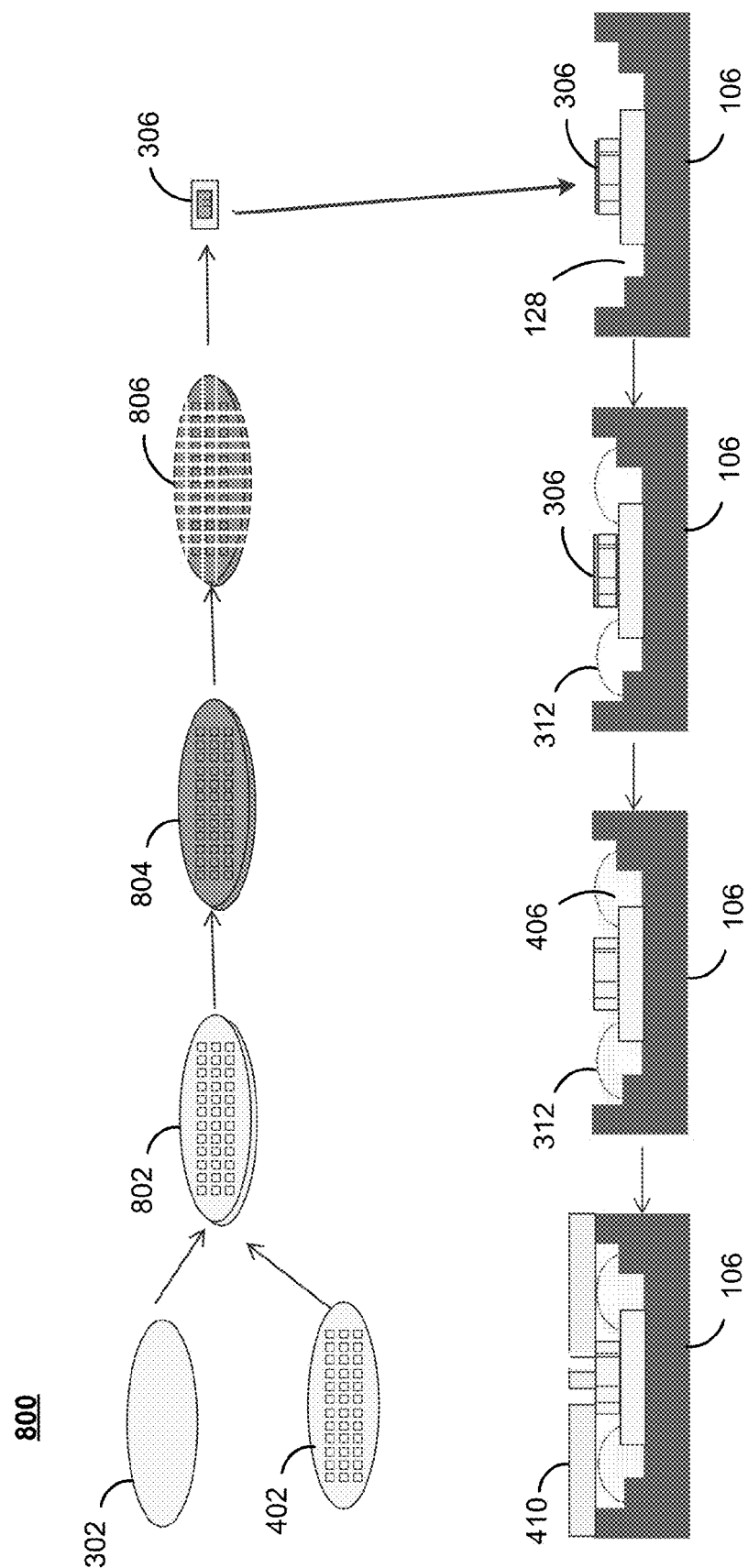
FIG. 8A is a block diagram illustrating a second exemplary method for the fabrication of analytical device packages in accordance with some embodiments of the present invention.
Figure 8B:
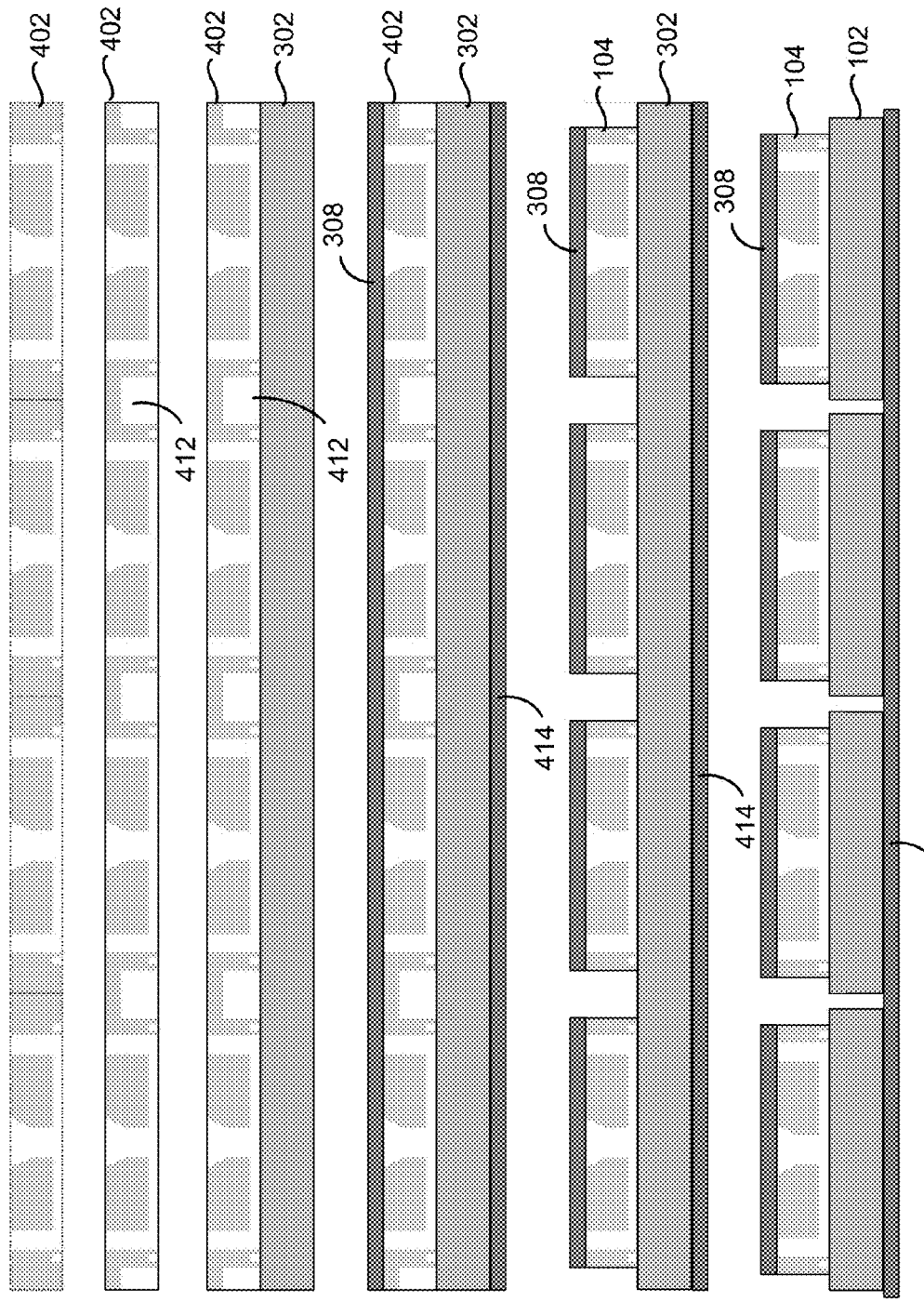
FIG. 8B is a block diagram illustrating modifications of the second exemplary method including some alternative, additional or optional processes in accordance with some embodiments of the present invention.
Figure 9:
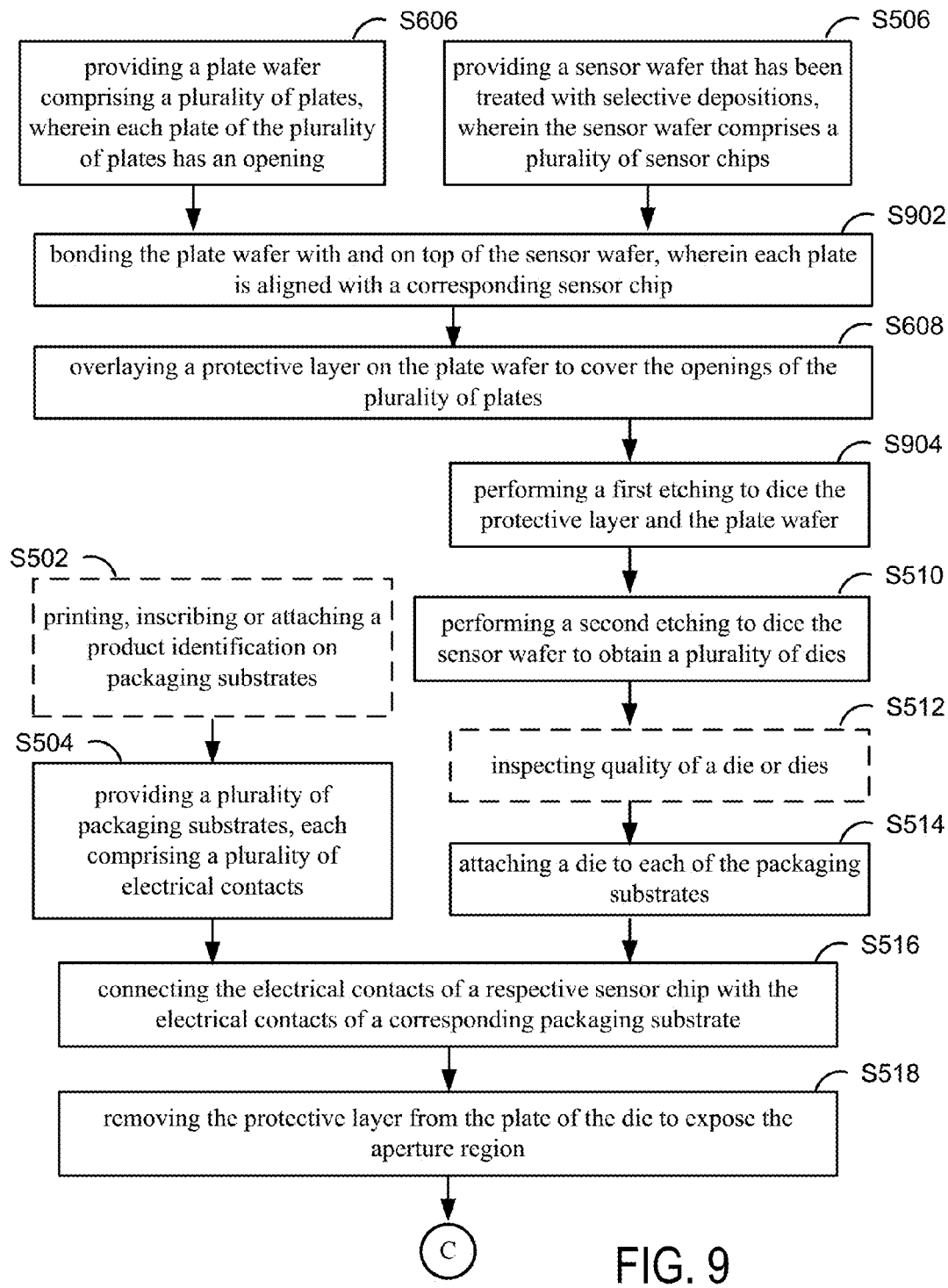
FIG. 9 is a flow chart illustrating the second exemplary method for the fabrication of analytical device packages in accordance with some embodiments of the present invention.

Referring now to FIGS. 8A, 8B and 9, which depict a second exemplary method 800 for the fabrication of analytical device packages in accordance with some embodiments of the present invention. As illustrated, a sensor wafer 302 that has been treated with selective depositions is provided at S506. As disclosed herein with respect to the first exemplary method 300, the treated sensor wafer 302 comprises a plurality of sensor chips, and each sensor chip comprises a plurality of electrical contacts and an aperture region with an array of nanometer-scale apertures. Treatment with the selective depositions produces different surface characteristics at different portions of the aperture region. A plate wafer 402 is provided at S606 and the plate wafer 402 comprises a plurality of plates 104 and each plate of the plurality of plates has an opening 110. It should be noted that the size and shape of the plate wafer do not necessarily need to match with the size and shape of the sensor wafer. Also, the number of the plurality of plates does not necessarily need to match the number of the plurality of sensor chips on the sensor wafer.

As shown, the plate wafer 402 is bonded at S902 with and on top of the treated sensor wafer 302. While bonding the plate wafer to the treated sensor wafer, in specific embodiments, care is taken to align the plate wafer with the treated sensor wafer so that one or each plate is aligned with a corresponding sensor chip and the opening of the plate is above the aperture region of the corresponding sensor chip.

Figure 13A:
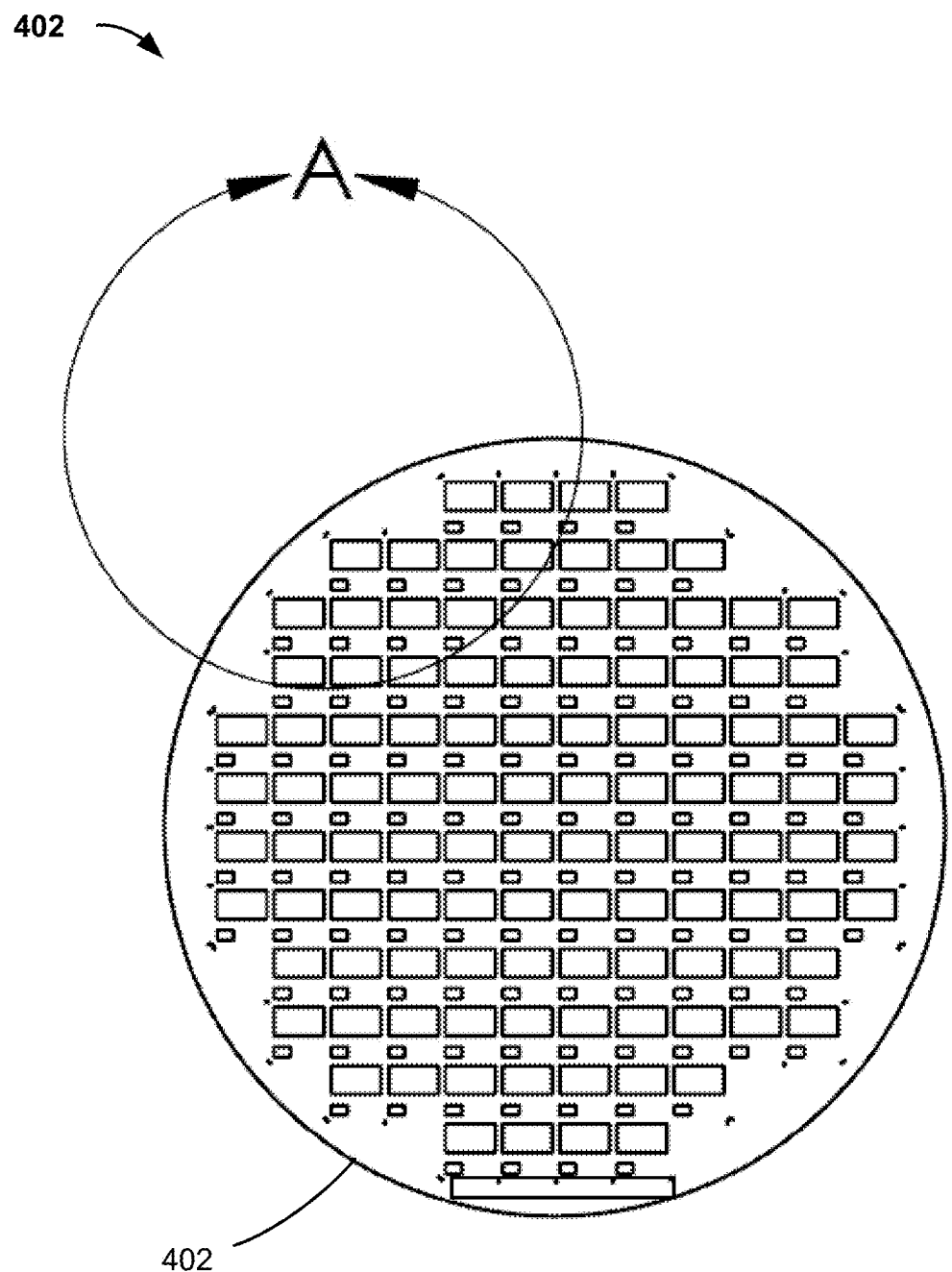
FIG. 13A is a top view schematically illustrating an exemplary plate wafer in accordance with some embodiments of the present invention.
Figure 13B:
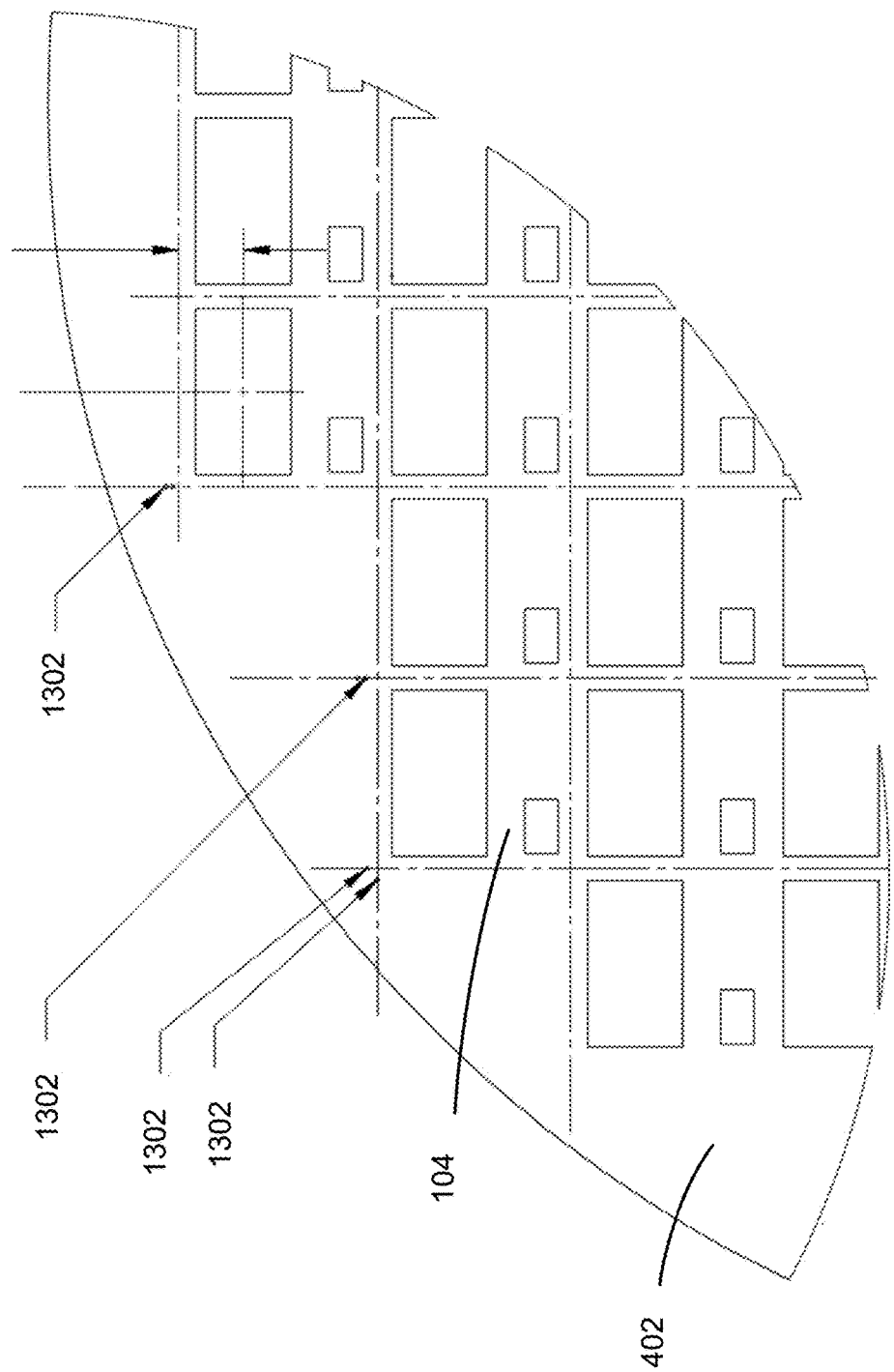
FIG. 13B is a partially enlarged view of the circle A in FIG. 13A.
Figure 14A:
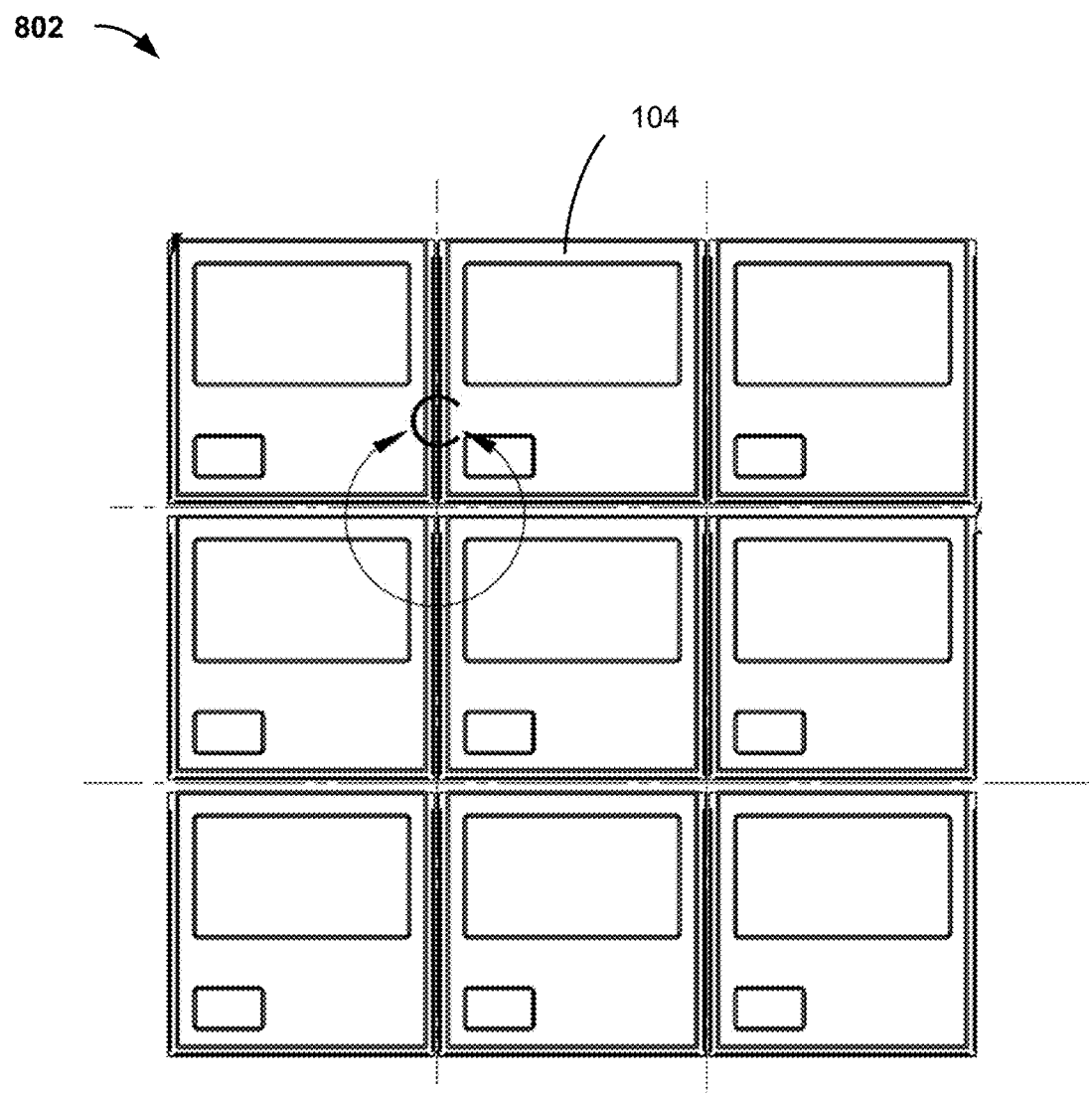
FIG. 14A is a top view schematically illustrating an exemplary plate wafer on top of a sensor wafer in accordance with some embodiments of the present invention.
Figure 14B:
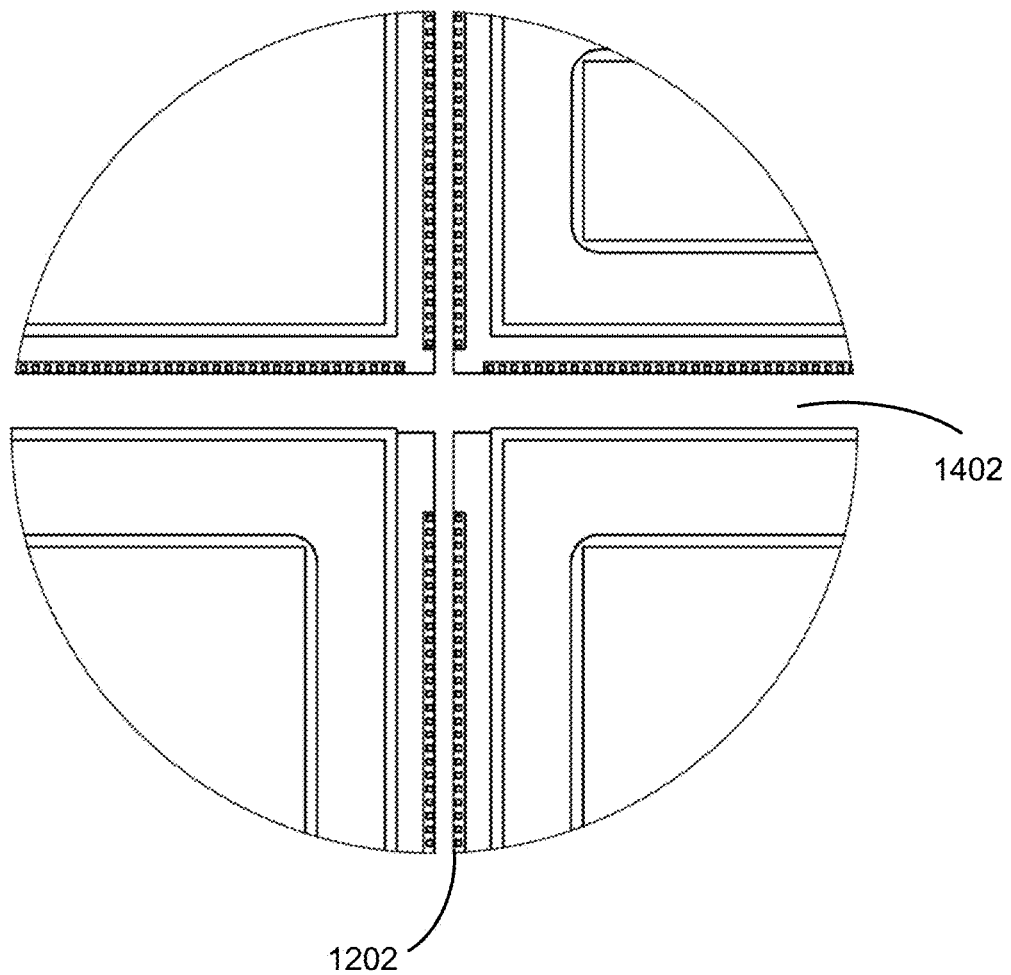
FIG. 14B is a partially enlarged view of the circle C in FIG. 14A.

After the plate wafer 402 is bonded on the treated sensor wafer 302 (referenced by 802 in FIG. 8A), a protective layer 308 is overlaid on the plate wafer 402 at S608 to cover the openings of the plurality of plates and thus protect the aperture regions during one or more of subsequent processes. Once the openings of the plurality of plates are covered by the protective layer, a first etching is performed at S904 followed by a second etching at S510. The first etching cuts the protective layer and dices the plate wafer to reveal the electrical contacts on the sensor wafer. In some cases, the first etching is performed following plate wafer dicing fiducials such as dicing fiducials 1302 as illustrated in FIGS. 13A and 13B. The second etching dices the sensor wafer to obtain a plurality of dies 306. In some cases, the second etching is performed along dicing streets such as dicing streets 1402 illustrated in FIGS. 14A and 14B. The first etching and the second etching can be conducted using any suitable patterning technique used in the micro-technology of semiconductors, including but not limited to wet etching, plasma etching, ion beam etching, reactive ion etching, ion milling, mechanical dicing (e.g., mechanical singulation) and laser dicing (e.g., laser singulation). One or a plurality of the dies (including in some embodiments each of the dies) comprises one sensor chip 102 and one stacked plate 304 (e.g., a plate 104 with a protective layer 308 on top of the plate 104). Remaining processes are the same as or similar to those disclosed herein with respect to the first exemplary method 300, its alternatives and its modifications, descriptions of which are thus omitted but are encompassed by this exemplary method in any combination.

Figure 10:
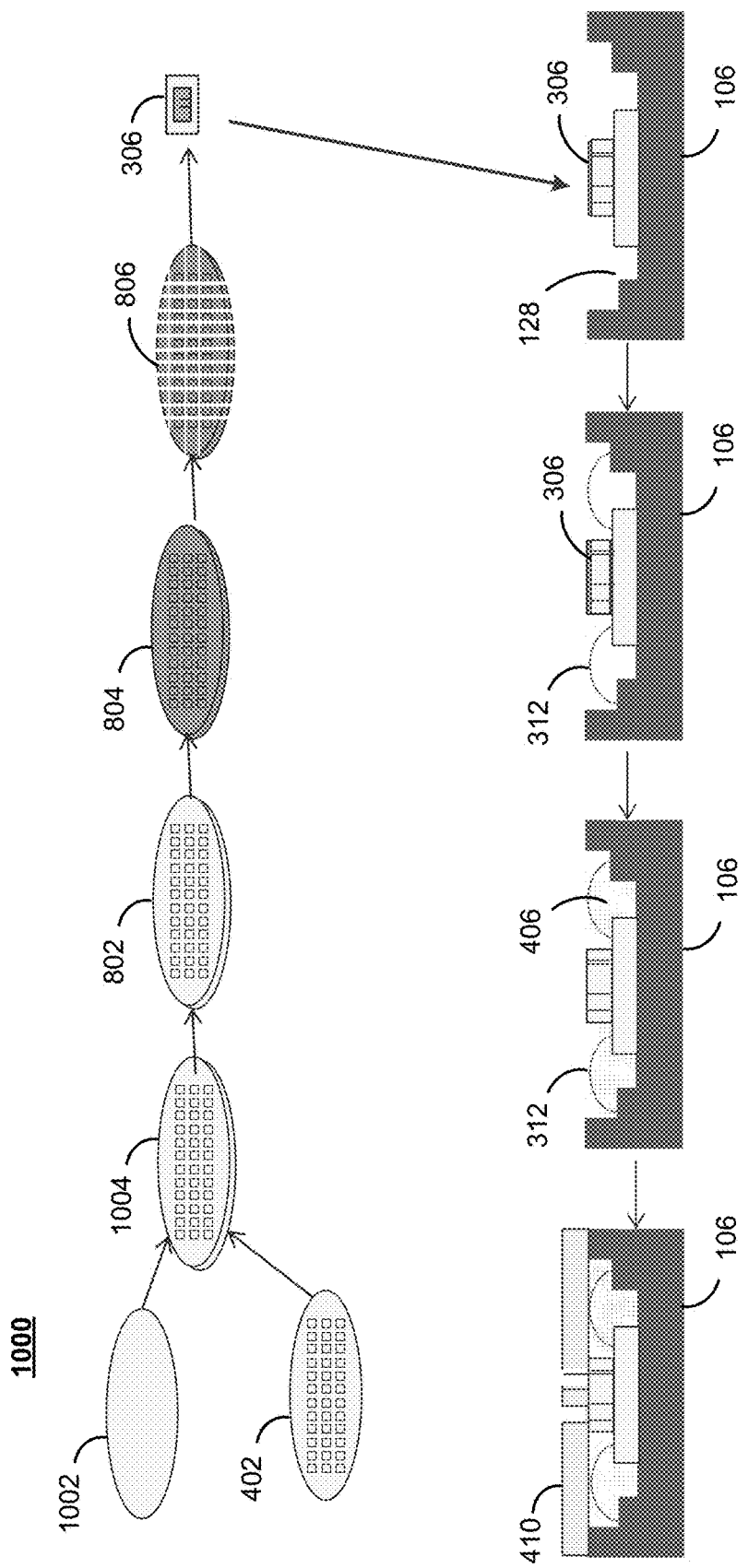
FIG. 10 is a block diagram illustrating modification of the second exemplary method for the fabrication of analytical device packages in accordance with some embodiments of the present invention.
Figure 11:
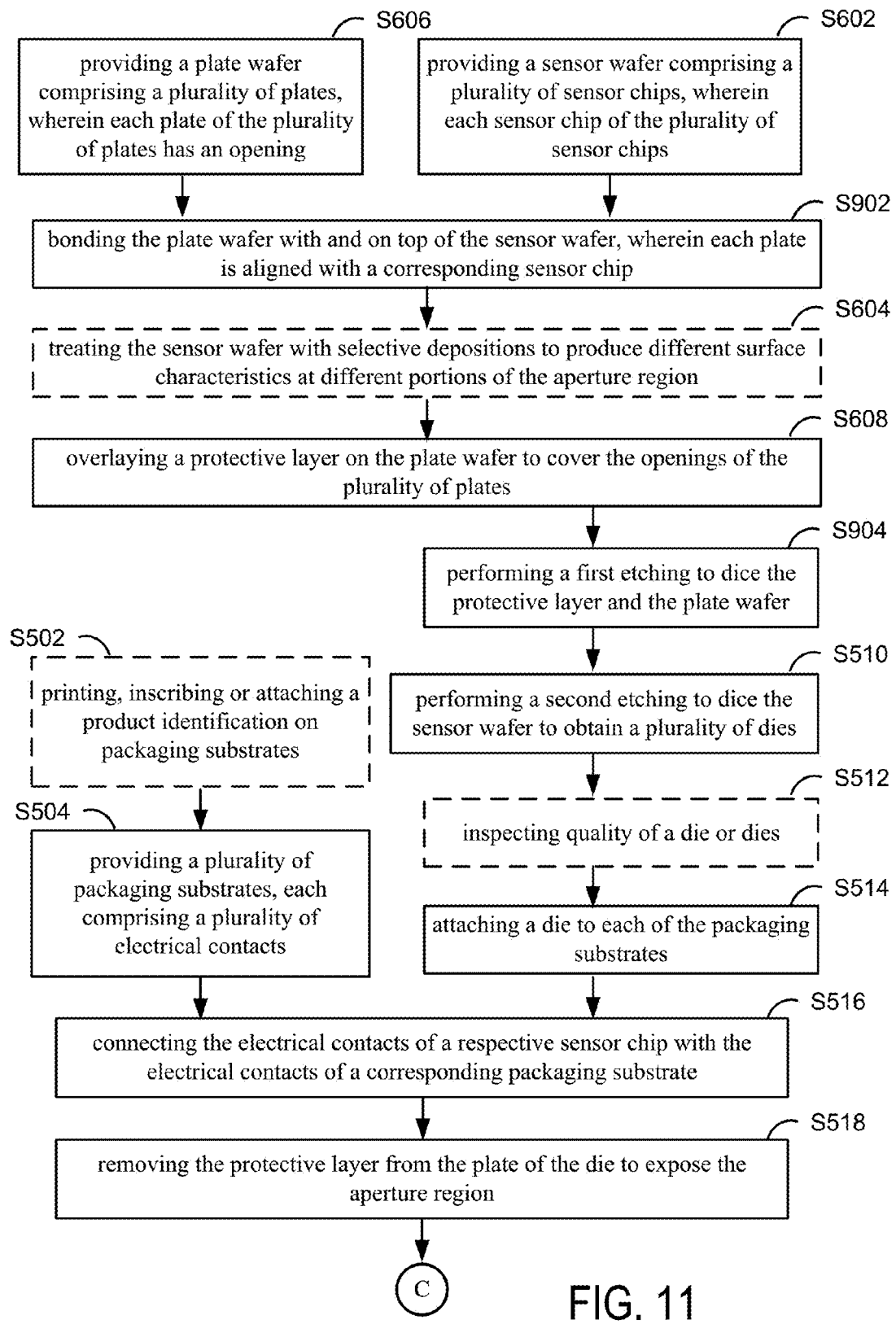
FIG. 11 is a flow chart illustrating modification of the second exemplary method for the fabrication of analytical device packages in accordance with some embodiments of the present invention.

Like the first exemplary method, in some cases, the second exemplary method includes alternative, additional or optional processes as such those disclosed herein with respect to the first exemplary method. For example, as an alternative to providing a treated sensor wafer 302, the second exemplary method can include a process that provides an untreated sensor wafer and a process that treats the sensor wafer with selective depositions. Treatment of the sensor wafer can be performed directly after the untreated sensor wafer is provided as illustrated in FIG. 6A. Treatment of the sensor wafer can also be performed after individual plates or a plate wafer bonded to the sensor wafer. For instance, FIGS. 10 and 12 illustrate the method including a process that provides an untreated sensor wafer such as untreated sensor wafer 1002 at S602 and a process that provides a plate wafer such as plate wafer 402 at S606. The plate wafer is then bonded with and on top of the sensor wafer at S902. The plate wafer is aligned with the sensor wafer such that one or each plate is aligned with a corresponding sensor chip, and the opening of the plate is above the aperture region of the corresponding sensor chip. The untreated sensor wafer with the plate wafer on top 1004 is then treated with selective depositions to produce different surface characteristics at different portions of the aperture region at S604. Afterwards, a protective layer is overlaid on the plate wafer to cover the openings of the plurality of plates and thus protect the aperture regions during one or more subsequent processes at S608. Same or similar processes are used to dice the plate wafer and the sensor wafer and to mount a die onto a substrate, descriptions of which are thus omitted.

In some cases, prior to bonding the plate wafer with and on top of the sensor wafer, the plate wafer 402 is diced or partially diced to obtain bonding pad grooves 412. The sensor wafer can be treated or non-treated. By way of illustration, FIG. 8B shows the plate wafer bonded to a surface-treated sensor wafer 302 after the bonding pad grooves 412 are formed. A protective layer 308 is then overlaid over the plate wafer 402, for example, on a side opposite to where the bonding pad grooves are formed as illustrated in FIG. 4C. In some cases, a dicing tape 414 is applied to the sensor wafer for securing the stack while dicing the plate water and the sensor wafer.

Referring now to FIGS. 17A and 18, there is depicted a third exemplary method 1700 for the fabrication of analytical device packages in accordance with some embodiments of the present invention. As illustrated, a sensor wafer 302 that has been treated with selective depositions is provided at S506. The sensor wafer 302 can be obtained by processes similar to or the same as processes S602 and S604 as illustrated in FIG. 6A. As disclosed herein with respect to the first and second exemplary methods, the treated sensor wafer 302 comprises a plurality of sensor chips, and each sensor chip comprises a plurality of electrical contacts and an aperture region with an array of nanometer-scale apertures. Treatment with the selective depositions produces different surface characteristics at different portions of the aperture region.

To obtain a plurality of dies 306, a laser is used at S1702 to dice the sensor wafer 302. In one case, each die includes one sensor chip 102. As laser dicing is a dry process, and requires no processing liquid such as water for dicing, the sensor wafer 302 can be diced directly without a top plate or other means to protect the functional or active area of the sensor wafer 302. As such, several components (e.g., the protective layer, the plate wafer) and several processes (e.g., dicing the plate wafer, mounting the plate on the sensor wafer) become unnecessary and can be eliminated. The methods thus have fewer steps and are relatively simple. In such cases, each die 306 can include a sensor chip but not a top plate. In addition, laser dicing in general provides better production yields with higher qualities.

It should be noted that while a protection is unnecessary for the sensor wafer during the laser dicing, the third exemplary method can include S508 or a similar process S1703 as an additional or optional process that mounts a plurality of plates on the sensor wafer before dicing the sensor wafer. The plate can be used for other purposes (e.g., for providing an optical inlet port for coupling with an external illumination light source) and/or to protect the sensor chip during other subsequent processes. It should also be noted that since a protection is unnecessary for the sensor wafer during the laser dicing, the plate can be attached to the die after dicing the sensor wafer. By way of example, FIG. 18 illustrates mounting a plate on the die at S1704, conducted after attaching a die to a packaging substrate and before connecting the electrical contacts of a respective sensor chip with the electrical contacts of a corresponding packaging substrate.

Other processes are the same as or similar to those disclosed herein with respect to the first and second exemplary methods, its alternatives and its modifications. Like the first and second exemplary methods, the third exemplary method can also include alternative, additional or optional processes as such those disclosed herein with respect to the first and second exemplary methods. For example, FIG. 17B illustrates that electrical bonds 312 are encapsulated by encapsulant 406. To avoid redundancy, descriptions of such features are thus omitted but are encompassed by this exemplary method in any combination.

In some cases, the third exemplary method does not include the additional process S508 that mounts a plurality of plates on the sensor wafer before dicing the sensor wafer or the additional process S1704 that mounting a plate on a die. In such cases, the third exemplary method produces an analytical device package that includes the packaging substrate 106 and the sensor chip 102 attached to the packaging substrate 106, but does not include the top plate 104. In some cases, the third exemplary method includes the additional process S1703 or S1704. In such cases, the third exemplary method produces an analytical device package that is substantially the same as those fabricated using the first and second methods, i.e., including the sensor chip 102, the packaging substrate 106 and the top plate 104.

An analytical device package fabricated by the methods of the present invention is an integrated miniaturized system and has many advantages. It integrates multiple functions into a single package, thereby reducing the number of moving components on the instrument, eliminating requirement for alignment and hence increasing reliability. It ensures the desired molecules (molecules of interest) to be attached to preselected locations within the observation regions. It allows analyzing the reaction of individual molecules (e.g., a single cell) or a relatively small numbers of molecules. It enables hundreds or thousands of analyses to be performed simultaneously on the same chip. It is compact and can be easily connected to various instruments for automatic diagnoses and analyses, thus reducing the risk of human handling error.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will be understood that, although the terms "first," "second," etc. may be used herein to describe various elements, these elements should not be limited by these terms. These terms are only used to distinguish one element from another. For example, a first surface characteristic could be termed a second surface characteristic, and, similarly, a second surface characteristic could be termed a first surface characteristic, without changing the meaning of the description, so long as all occurrences of the "first surface characteristic" are renamed consistently and all occurrences of the "second surface characteristic" are renamed consistently.

All patents, patent publications, and other published references mentioned herein are hereby incorporated by reference in their entireties as if each had been individually and specifically incorporated by reference herein.

While specific examples have been provided, the above description is illustrative and not restrictive. Any one or more of the features of the previously described embodiments can be combined in any manner with one or more features of any other embodiments in the present invention. Furthermore, many variations of the invention will become apparent to those skilled in the art upon review of the specification. The scope of the invention should, therefore, be determined by reference to the appended claims, along with their full scope of equivalents.

What is claimed is:

1. A method for making analytical device packages, comprising:
 (a) providing a sensor wafer that has been treated with selective depositions, wherein the sensor wafer comprises a plurality of sensor chips, and each sensor chip comprises a plurality of electrical contacts and an aperture region with an array of nanometer-scale apertures, wherein treatment with the selective depositions produces different surface characteristics at different portions of the aperture region;
 (b) mounting a plurality of plates on the sensor wafer, wherein each plate is aligned with a corresponding sensor chip such that an opening of the plate is above the aperture region of the corresponding sensor chip, and the opening of the plate is covered by a protective layer to protect the aperture region of the corresponding sensor chip during at least one subsequent process;

(c) dicing the sensor wafer to obtain a plurality of dies, wherein each die comprises one sensor chip and one plate on top of the one sensor chip;

(d) providing a plurality of packaging substrates, each comprising a plurality of electrical contacts;

(e) attaching a die to each of the packaging substrates;

(f) connecting the electrical contacts of a respective sensor chip with the electrical contacts of a corresponding packaging substrate; and (g) removing the protective layer from the plate of the die to expose the aperture region.

2. The method of claim 1, wherein the selective depositions produce a first surface characteristic on a base of at least one nanometer-scale aperture in at least one sensor chip and a second surface characteristic on a side wall or a top of the at least one nanometer-scale aperture in the at least one sensor chip, wherein the first surface characteristic is different from the second surface characteristic.

3. The method of claim 1, wherein removing the protective layer from the plate of the die is conducted prior or subsequent to connecting the electrical contacts.

4. The method of claim 1, wherein providing a plurality of packaging substrates is conducted prior to, subsequent to or concurrently with one or more of the following: providing a sensor wafer, treating the sensor wafer with selective depositions, mounting a plurality of plates on the sensor wafer, and dicing the sensor wafer.

5. The method of a claim 1, wherein one or more of the following steps: (i) attaching a die to the packaging substrate, (ii) removing the protective layer from the plate of the die and (iii) connecting the electrical contacts, are conducted in an environment having a condition that preserves the selective depositions.

6. The method of claim 5, wherein the condition that preserves the selective depositions includes humidity of the environment that is at most 65% relative humidity for 48 hours, at most 50% relative humidity for 48 hours, or at most 35% relative humidity for 48 hours.

7. The method of claim 1, wherein connecting the electrical contacts of the sensor chip with the electrical contacts of the packaging substrate is conducted at a room temperature range.

8. The method of claim 7, wherein the room temperature range is between 10 to 20° C., between 20 to 30° C., or between 30 to 40° C.

9. The method of claim 1, wherein treatment of the sensor wafer with the selective depositions to produce different surface characteristics at different portions of the at least one nanometer-scale aperture comprises:

exposing a surface of the sensor wafer having both silica-based portions and metal or metal oxide portions to an agent that preferentially binds to the metal or metal oxide portions to produce passivated metal or metal oxide portions of the surface; and exposing the surface of the sensor wafer to a silica functionalizing agent that binds to both the silica-based portions and the passivated metal or metal oxide portions of the surface, then rinsing the surface of the packaging substrate.

10. The method of claim 1, wherein treatment of the sensor wafer with the selective depositions to produce different surface characteristics at different portions of the at least one nanometer-scale aperture comprises:

treating a surface of the sensor wafer having both silica-based portions and metal or metal oxide portions with a compound comprising phosphate or phosphonate groups to produce passivated metal or metal oxide portions of the surface; and treating the surface of the sensor wafer with a silica functionalizing agent that binds to both the silica-based and the passivated metal or metal oxide portions of the surface.

11. The method of claim 1, wherein the different surface characteristics on different portions of at least one nanometer-scale aperture in at least one sensor chip includes a first surface characteristic and a second surface characteristic that is different from the first surface characteristic, wherein:

the first surface characteristic has a transparent portion that is bound with sufficient coupling agent for binding a desired molecule to be analyzed, and the second surface characteristic has an opaque or reflective portion that is either coated with a passivating compound, having no coupling agent or having very low levels of coupling agent.

12. The method of claim 1, wherein the sensor wafer comprises at least 10, at least 100, or at least 1,000 sensor chips.

13. The method of claim 1, wherein each sensor chip comprises at least 1,000, at least 10,000, at least 100,000, at least 1,000,000, or at least 10,000,000 nanometer-scale apertures.

14. The method of claim 1, wherein each sensor chip of the plurality of sensor chips further comprises:

a waveguide layer below the aperture region and configured for illumination of the array of the nanometer-scale apertures; and a detection layer below the waveguide layer and configured for detecting optical signals emitted from a sample in the array of the nanometer-scale apertures.

15. The method of claim 14, wherein the detection layer comprises an array of pixels with one or more pixels designated for each nanometer-scale aperture.

16. The method of claim 14, wherein the detection layer comprises at least 1 million pixels, at least 2 million pixels, at least 3 million pixels, at least 4 million pixels, or at least 5 million pixels, wherein one or more pixels are designated for each nanometer-scale aperture.

17. The method of claim 1, wherein the plurality of plates are fixedly bonded to the sensor wafer by a first adhesive.

18. The method of claim 17, wherein the first adhesive is selected from the group consisting of epoxy adhesives, acrylic-ester-based adhesives, mercapto-ester-based adhesives and silicone materials.

19. The method of claim 1, wherein the protective layer prevents a processing liquid from reaching the selective depositions during dicing the sensor wafer.

20. The method of claim 19, wherein the processing liquid includes water.

21. The method of claim 1, further comprising:
providing a plate wafer;
overlaying the protective layer on the plate wafer; and
dicing the plate wafer with the protective layer overlaid on the plate wafer to obtain the plurality of plates with the protective layer on top.

22. The method of claim 21, further comprising
dicing, prior to overlying the protective layer on the plate wafer, the plate wafer to provide bonding pad grooves.

23. The method of claim 22, wherein the protective layer are overlaid on a side of the plate wafer opposite to where the bonding pad grooves are formed.

24. The method of claim 21, further comprising
trimming the protective layer along an edge of the plate wafer after overlaying the protective layer on the plate wafer.

25. The method of claim 21, wherein the plate wafer is made of a material selected from the group consisting of: plastic, metal, plastic with metal inserts, plastic with surface metallization coating, and metal with passivation.

26. The method of claim 21, wherein the plate wafer is made of a material selected from the group consisting of: silicon, glass and aluminum.

27. The method of claim 21, wherein the protective layer is a tape or a foil laminated on the plate wafer.

28. The method of claim 21, wherein the protective layer is a sacrificial glass wafer bonded onto the plate wafer.

29. The method of claim 1, wherein the protective layer is attached to each individual plate.

30. The method of any preceding claim, further comprising:
inspecting quality of the die prior to attaching the die to the packaging substrate.

31. The method of claim 1, wherein the die has a substantially square shape with a length that is between 10 to 15 mm, between 15 to 20 mm, between 20 to 25 mm or between 25 to 30 mm.

32. The method of claim 1, wherein the packaging substrate is made of a material comprising alumina ceramic or aluminum nitride.

33. The method of claim 1, wherein the packaging substrate has a substantially square shape with a recess to accommodate at least a portion of the die.

34. The method of claim 33, wherein the packaging substrate at the recess has a thickness that allows for magnetic bead loading and the packaging substrate on one or more edges has a thickness that provides mechanical strength for performing the steps of attaching a die to the packaging substrate, removing the protective layer from the plate of the die and connecting the electrical contacts.

35. The method of claim 33, wherein the packaging substrate at the recess has a thickness that is at most 1.0 mm and the packaging substrate on one or more edges has a thickness that is at least 2.0 mm.

36. The method of claim 1, wherein the die is fixedly bonded to the packaging substrate by a second adhesive.

37. The method of claim 36, wherein the second adhesive comprises a thermally conductive adhesive.

38. The method of claim 36, wherein the second adhesive comprises silver filled epoxy.

39. The method of claim 1, wherein the electrical contacts of the sensor chip are connected with the electrical contacts of the packaging substrate by wires, pads, solder bonds, gold compression bonding, or any combination thereof.

40. The method of claim 1, wherein the electrical contacts of the sensor chip is connected with the electrical contacts of the packaging substrate by aluminum wires.

41. The method of claim 1, further comprising:
encapsulating electrical bonds that connect the electrical contacts of the sensor chip with the electrical contacts of the packaging substrate.

42. The method of claim 41, wherein encapsulating the electrical bonds is conducted using an encapsulant selected from the group consisting of silicon encapsulants, UV cure materials and epoxy materials.

43. The method of claim 1, further comprising:
attaching, subsequent to attaching a die to the packaging substrate, a cover to the die and/or the packaging substrate to protect the die, wherein the cover comprises a base formed with one or more of a fluid inlet port, a fluid outlet port and an optical port, wherein the fluid inlet and outlet ports are fluidly connected to the opening of the plate, and the optical port is configured for coupling with an elimination light source.

44. The method of claim 41, further comprising:
attaching, subsequent to encapsulating electrical bonds, a cover to the die and/or the packaging substrate to protect the die, wherein the cover comprises a base formed with one or more of a fluid inlet port, a fluid outlet port and an optical port, wherein the fluid inlet and outlet ports are fluidly connected to the opening of the plate, and the optical port is configured for coupling with an elimination light source.

45. The method of claim 43, wherein the base is made of a material comprising Acrylonitrile Butadiene Styrene (ABS).

46. The method of claim 43, wherein the cover further comprises a top fixedly coupled to the base or monolithically formed with the base, wherein the top comprises a port used for picking up the analytical device package.

47. The method of claim 46, wherein the base is made of a material comprising ABS and the top is made of a material comprising polypropylene.

48. The method of claim 43, wherein the fluid inlet port is configured for accommodating a pipette for pipetting the fluid into the opening of the plate.

49. The method of claim 43, wherein the cover is fixedly bonded to the die and/or the packaging substrate by a third adhesive.

50. The method of claim 49, wherein the third adhesive is selected from the group consisting of epoxy adhesives, acrylic-ester-based adhesives, mercapto-ester-based adhesives and silicone materials.

51. The method of claim 1, further comprising:
programming a chip identifier to the sensor chip.

52. The method of claim 1, further comprising:
printing, inscribing or attaching a product identification on the packaging substrate.

53. The method of claim 52, wherein printing, inscribing or attaching the product identification is conducted prior to attaching the die to the packaging substrate.

54. The method of claim 52, wherein the product identification comprises one or more of the following: a barcode, a tag, a product name, a chip identifier and a company logo.

55. An analytical device package made by the method of claim 1.

56. The method of claim 1, wherein providing a sensor wafer that has been treated with selective depositions comprises:
providing the sensor wafer comprising the plurality of sensor chips; and
treating the sensor wafer with the selective depositions to produce the different surface characteristics at the different portions of the aperture region.

* * * * *